(12) United States Patent
Choi et al.

(10) Patent No.: US 11,709,629 B2
(45) Date of Patent: *Jul. 25, 2023

(54) NONVOLATILE MEMORY DEVICE

(71) Applicant: SAMSUNG ELECTRONICS CO., LTD., Suwon-si (KR)

(72) Inventors: Yonghyuk Choi, Suwon-si (KR); Jaeduk Yu, Seoul (KR); Sangwan Nam, Hwaseong-si (KR); Sangwon Park, Seoul (KR); Daeseok Byeon, Seongnam-si (KR); Bongsoon Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

This patent is subject to a terminal disclaimer.

(21) Appl. No.: 17/455,037

(22) Filed: Nov. 16, 2021

(65) Prior Publication Data

US 2022/0075565 A1  Mar. 10, 2022

Related U.S. Application Data

(63) Continuation of application No. 16/918,310, filed on Jul. 1, 2020, now Pat. No. 11,200,002.

(30) Foreign Application Priority Data

Nov. 19, 2019  (KR) .......................... 10-2019-0148349

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC ..... G11C 16/0483; G11C 16/10; G11C 16/26; G11C 16/08; G11C 11/5628; G11C 16/32;
(Continued)

(56) References Cited

U.S. PATENT DOCUMENTS 7,793,471 B2  9/2010  Hill
8,030,700 B2  10/2011  Sakamoto
(Continued)

OTHER PUBLICATIONS

Notice of Allowance dated Aug. 10, 2021 in Corresponding U.S. Appl. No. 16/918,310.

*Primary Examiner* — Thong Q Le
(74) *Attorney, Agent, or Firm* — F. Chau & Associates, LLC

(57) ABSTRACT

A nonvolatile memory device includes a first semiconductor layer including an upper substrate in which word-lines extending in a first direction and bit-lines extending in a second direction are disposed and a memory cell array, a second semiconductor layer, a control circuit, and a pad region. The memory cell array includes a vertical structure on the upper substrate, and the vertical structure includes memory blocks. The second semiconductor layer includes a lower substrate that includes address decoders and page buffer circuits. The vertical structure includes via areas in which one or more through-hole vias are provided, and the via areas are spaced apart in the second direction. The memory cell array includes mats corresponding to different bit-lines of the bit-lines. At least two of the mats include a different number of the via areas according to a distance from the pad region in the first direction.

14 Claims, 26 Drawing Sheets

(51) Int. Cl.
*G11C 16/08* (2006.01)
*G11C 16/24* (2006.01)
*G11C 16/04* (2006.01)
*H10B 41/27* (2023.01)
*H10B 43/27* (2023.01)

(52) U.S. Cl.
CPC .......... *G11C 16/0483* (2013.01); *G11C 16/08* (2013.01); *G11C 16/24* (2013.01); *H10B 41/27* (2023.02); *H10B 43/27* (2023.02)

(58) Field of Classification Search
CPC . G11C 16/0466; G11C 16/24; G11C 16/3427; G11C 11/5635; G11C 16/0416; G11C 16/0491; G11C 16/28; G11C 16/3431; G11C 16/30; G11C 16/16; G11C 16/3459; G11C 2029/1202; G11C 8/08; G11C 16/06; G11C 8/12; G11C 8/14; G11C 11/4074; G11C 11/4082; G11C 11/4085; G11C 11/4097; G11C 16/3436; G11C 2207/2209; G11C 2211/5642; G11C 5/025; G11C 7/1057; G11C 7/109; G11C 7/12; G11C 2029/0411; G11C 5/063; G11C 7/1084; G11C 8/10; G11C 16/0425; G11C 16/14; G11C 16/20; G11C 16/34; G11C 16/3404; G11C 16/3445; G11C 2029/1204; G11C 2029/1802; G11C 2029/5006; G11C 2211/5643; G11C 29/025; G11C 29/12005; G11C 29/14; G11C 29/18; G11C 29/44; G11C 29/46; G11C 29/76; G11C 29/82; G11C 7/04; G11C 7/06; G11C 7/1012; G11C 7/1048; G11C 7/1051; G11C 14/0054; G11C 16/04; G11C 16/344; G11C 19/287; G11C 2211/5612; G11C 29/006; G11C 29/04; G11C 29/42; G11C 29/789; G11C 5/147; G11C 7/10; G11C 7/1006; G11C 7/106; G11C 7/1087; G11C 7/18; G06F 11/1048; G06F 11/2094; G06F 2201/85; G06F 3/0604; G06F 3/0659; G06F 3/0679; G06F 11/1008; G06F 12/0246; G06F 12/0882; G06F 13/1673

See application file for complete search history.

(56) References Cited

U.S. PATENT DOCUMENTS

| | | |
|---|---|---|
| 8,461,639 B2 | 6/2013 | Jeong et al. |
| 8,587,035 B2 | 11/2013 | Takayama et al. |
| 8,629,052 B2 | 1/2014 | Park et al. |
| 8,679,965 B2 | 3/2014 | Park |
| 8,823,086 B2 | 9/2014 | Cho |
| 10,014,309 B2 | 7/2018 | Dorhout et al. |
| 2014/0160847 A1 | 6/2014 | Kwak |
| 2021/0149598 A1* | 5/2021 | Choi ...................... G11C 16/32 |

* cited by examiner

NONVOLATILE MEMORY DEVICE

CROSS-REFERENCE TO RELATED APPLICATION

This U.S. patent application is a continuation application of U.S. patent application Ser. No. 16/918,310 filed Jul. 1, 2020, claims priority under 35 U.S.C. § 119 to Korean Patent Application No. 10-2019-0148349, filed on Nov. 19, 2019 in the Korean Intellectual Property Office (KIPO), the disclosure of which is incorporated by reference herein in its entirety.

TECHNICAL FIELD

Exemplary embodiments of the inventive concept relate generally to memory devices, and more particularly to nonvolatile memory devices.

DISCUSSION OF RELATED ART

Semiconductor memory devices may be volatile or nonvolatile. Flash memory devices are typically nonvolatile semiconductor memory devices. Flash memory devices may be used as a voice and image data storing medium for information appliances, such as a computer, a cellular phone, a personal digital assistant (PDA), a digital camera, a handheld personal computer (PC), or the like.

Recently, nonvolatile memory devices having memory cells that are stacked in three dimensions have been researched to improve integrity of the nonvolatile memory devices. As information communication devices are being developed to have multitudes of functions, memories for such devices may require a large capacity and a high degree of integration. As memory cell sizes decrease to achieve high integration, the structural complexity of operation circuits and/or wirings included in the memory devices can degrade electrical characteristics.

SUMMARY

According to an exemplary embodiment of the inventive concept, a nonvolatile memory device includes a first semiconductor layer, a second semiconductor layer, a control circuit, and a pad region. The first semiconductor layer includes an upper substrate in which a plurality of word-lines extending in a first direction and a plurality of bit-lines extending in a second direction perpendicular to the first direction are disposed and a memory cell array including a vertical structure on the upper substrate, and the vertical structure includes a plurality of memory blocks. The second semiconductor layer is disposed under the first semiconductor layer in a third direction perpendicular to the first and second directions, and includes a lower substrate that includes a plurality of address decoders and a plurality of page buffer circuits configured to control the memory cell array. The control circuit controls the plurality of address decoders and the plurality of page buffer circuits in response to a command and an address from an external device. The pad region is disposed adjacent to the first semiconductor layer in the first direction and extends in the second direction. The vertical structure includes a plurality of via areas in which one or more through-hole vias are provided and the plurality of via areas are spaced apart in the second direction. The memory cell array includes a plurality of mats corresponding to different bit-lines of the plurality of bit-lines. At least two of the plurality of mats include a different number of the via areas according to a distance from the pad region in the first direction.

According to an exemplary embodiment of the inventive concept, a nonvolatile memory device includes a first semiconductor layer, a second semiconductor layer, a control circuit, and a pad region. The first semiconductor layer includes an upper substrate in which a plurality of word-lines extending in a first direction and a plurality of bit-lines extending in a second direction perpendicular to the first direction are disposed and a memory cell array including a vertical structure on the upper substrate, and the vertical structure includes a plurality of memory blocks. The second semiconductor layer is disposed under the first semiconductor layer in a third direction perpendicular to the first and second directions, and includes a lower substrate that includes a plurality of address decoders and a plurality of page buffer circuits configured to control the memory cell array. The control circuit controls the plurality of address decoders and the plurality of page buffer circuits in response to a command and an address from an external device. The pad region is disposed adjacent to the first semiconductor layer in the first direction and extends in the second direction. The vertical structure includes a plurality of via areas in which one or more through-hole vias are provided and the plurality of via areas are spaced apart in the second direction. At least a first portion of the one or more through-hole vias connect at least some portion of the plurality of bit-lines to at least some portion of the plurality of page buffer circuits. At least a second portion of the one or more through-hole vias connect at least some portion of the plurality of word-lines to at least some portion of the plurality of address decoders. The memory cell array includes a plurality of mats corresponding to different bit-lines of the plurality of bit-lines. Each of the plurality of mats includes a first tile and a second tile which are identified based on a distance from the pad region in the first direction. The first tile and the second tile include a different number of the via areas according to the distance from the pad region in the first direction.

According to an exemplary embodiment of the inventive concept, a nonvolatile memory device includes a first semiconductor layer, a second semiconductor layer, a control circuit, and a pad region. The first semiconductor layer includes an upper substrate in which a plurality of word-lines extending in a first direction and a plurality of bit-lines extending in a second direction perpendicular to the first direction are disposed and a memory cell array including a vertical structure on the upper substrate, and the vertical structure includes a plurality of memory blocks. The second semiconductor layer is disposed under the first semiconductor layer in a third direction perpendicular to the first and second directions, and includes a lower substrate that includes a plurality of address decoders and a plurality of page buffer circuits configured to control the memory cell array. The control circuit controls the plurality of address decoders and the plurality of page buffer circuits in response to a command and an address from an external device. The pad region is disposed adjacent to the first semiconductor layer in the first direction and extends in the second direction. A plurality of input/output pads and at least one power pad are provided in the pad region. The vertical structure includes a plurality of via areas in which one or more through-hole vias are provided and the plurality of via areas are spaced apart in the second direction. The at least one power pad is disposed adjacent to a first edge portion of the pad region. The memory cell array includes a plurality of mats corresponding to different bit-lines of the plurality of bit-lines. At least two of the plurality of mats include a different number of the via areas according to a distance from the at least one power pad in the second direction.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
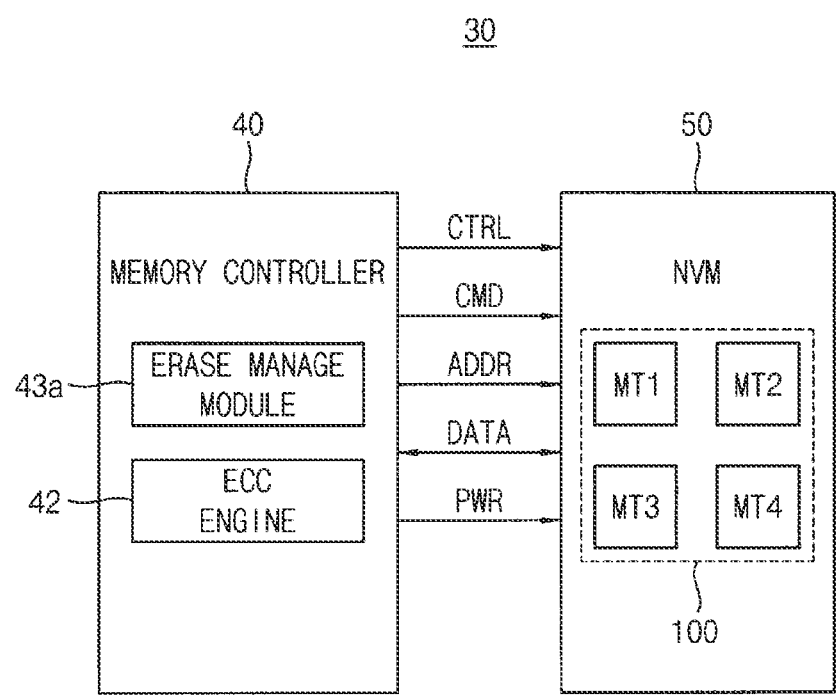
FIG. 1 is a block diagram illustrating a storage device according to an exemplary embodiment of the inventive concept.

Exemplary embodiments of the inventive concept provide a nonvolatile memory device with enhanced performance and reduced size.

Exemplary embodiments of the inventive concept will be described more fully hereinafter with reference to the accompanying drawings. Like reference numerals may refer to like elements throughout this application.

FIG. 1 is a block diagram illustrating a storage device according to an exemplary embodiment of the inventive concept.

Referring to FIG. 1, a storage device (or a memory system) 30 may include a memory controller 40 and a nonvolatile memory device (NVM) 50.

In exemplary embodiments of the inventive concept, each of the memory controller 40 and the nonvolatile memory device 50 may be provided in the form of a chip, a package, or a module. Alternatively, the memory controller 40 and the nonvolatile memory device 50 may be mounted on various packages to be provided as a storage device such as a memory card.

The nonvolatile memory device 50 may perform a read operation, an erase operation, and a program operation or a write operation under control of the memory controller 40. The nonvolatile memory device 50 receives a command CMD, an address ADDR, and data DATA through input/output lines from the memory controller 40 for performing such operations. In addition, the nonvolatile memory device 50 receives a control signal CTRL through a control line from the memory controller 40. In addition, the nonvolatile memory device 50 receives a power PWR through a power line from the memory controller 40.

The nonvolatile memory device 50 may include a memory cell array 100 to store data DATA and the memory cell array 100 may include a plurality of mats MT1, MT2, MT3, and MT4 corresponding to different bit-lines.

Memory cells of the nonvolatile memory device 50 may have the physical characteristic where a threshold voltage distribution varies due to different causes, such as a program elapsed time, a temperature, program disturbance, read disturbance, etc. As such, data stored at the nonvolatile memory device 50 may become erroneous (e.g., have errors) due to the above causes. The memory controller 40 may utilize a variety of error correction techniques to correct such errors. For example, the memory controller 40 may include an error correction code (ECC) engine 42.

The memory controller 40 may perform an erase operation on the nonvolatile memory device 50 by sub-block unit, and a sub-block is smaller than one memory block of the nonvolatile memory device 50. As an example, one memory block may include a plurality of sub-blocks. The memory controller 40 may include an erase manage module 43a to manage the erase operation by sub-block unit (e.g., sub-block erase operations).

After a sub-block erase operation, the erase manage module 43a may check an erase status of an erased sub-block and/or a sub-block adjacent to the erased sub-block. For example, the erase manage module 43a may sense memory cells of the erased sub-block to determine whether specific parameters exceed a reference value. The erase manage module 43a may read data of sub-block(s) adjacent to the erased sub-block to detect erase-inhibition efficiency. For example, the erase manage module 43a may detect bit error rate (BER) based on data read from the erased sub-block. The erase manage module 43a may acquire and monitor wear-leveling information (e.g., erase count) on the erased sub-block. In addition, the erase manage module 43a may read data of the erased sub-block to monitor a variation in threshold voltages of selected memory cells and/or a variation in the bit error rate (BER). The erase manage module 43a may also read data of an unselected sub-block to detect a variation in a threshold voltage. The memory controller 40 may perform various procedures to compensate for insufficient erasing of a selected sub-block based on erase status information detected by the erase manage module 43a.

Generally, a memory block is the maximum memory unit that may be erased at the same time. In a three-dimensional nonvolatile memory device, where word-lines are stacked in a direction intersecting (e.g., perpendicular to) a substrate, a memory block may be defined as a group of cell strings sharing all stacked word-lines. A sub-block corresponds to a sub-memory unit defined by dividing the memory block (or physical block) by word line unit or selection line unit. For example, each sub-block may be formed of memory cells sharing a portion of the word-lines of the memory block.

During a read operation on the nonvolatile memory device 50, the memory controller 40 may read data stored at a first page of the nonvolatile memory device 50, using a default read voltage set. The default read voltage set may include predetermined read voltages. The ECC engine 42 may detect and correct errors included in data read from the nonvolatile memory device 50. The ECC engine 42 may perform an ECC operation by detecting and correcting errors. In exemplary embodiments of the inventive concept, the ECC engine 42 may be implemented in the form of hardware. The ECC engine 42 may determine error occurrence frequency in the read data from the nonvolatile memory device 50 by units of sub-blocks, and may designate a sub-block as a bad sub-block when error occurrence frequency is greater than a reference value during a predetermined time.

Figure 2:
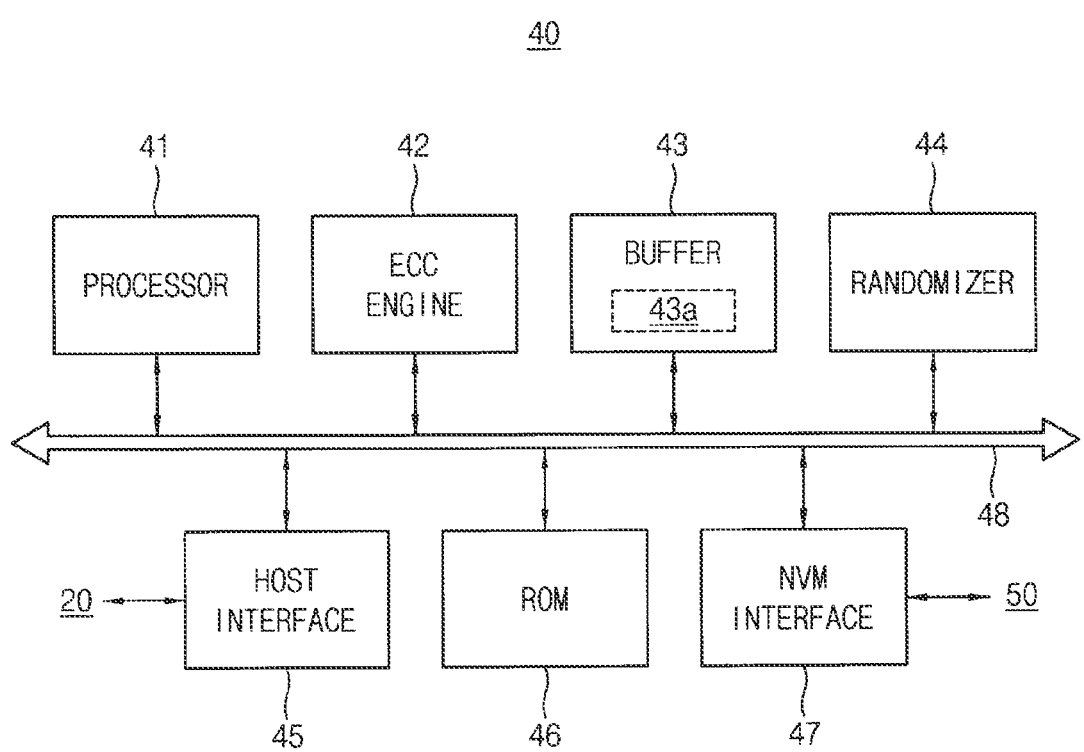
FIG. 2 is a block diagram illustrating a memory controller in the storage device of FIG. 1 according to an exemplary embodiment of the inventive concept.

FIG. 2 is a block diagram illustrating a memory controller in the storage device of FIG. 1 according to an exemplary embodiment of the inventive concept.

Referring to FIGS. 1 and 2, the memory controller 40 may include a processor 41, the ECC engine 42, the buffer 43, the erase manage module 43a, a randomizer 44, a host interface 45, a read only memory (ROM) 46, and a nonvolatile memory interface 47 which are connected via a bus 48. The ECC engine 42 and the erase manage module 43a are described with reference to FIG. 1, and a description thereof is thus omitted.

The processor 41 controls an overall operation of the memory controller 40. In exemplary embodiments of the inventive concept, the erase manage module 43a may be implemented in software and stored in the buffer 43. The erase manage module 43a stored in the buffer 43 may be driven by the processor 41. The ROM 46 stores a variety of information in firmware for the memory controller 40 to operate. The buffer 43 may store data provided from the nonvolatile memory device 50 and may include the erase manage module 43a.

The randomizer 44 randomizes data to be stored in the nonvolatile memory device 50. For example, the randomizer 44 may randomize data to be stored in the nonvolatile memory device 50 in units of word-lines.

Data randomizing is to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 44 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 44 also de-randomizes data read from the nonvolatile memory device 50.

The memory controller 40 communicates with an external host 20 through the host interface 45. For example, the host interface 45 may include Universal Serial Bus (USB), Multimedia Card (MMC), embedded-MMC, peripheral component interconnect (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), non-volatile memory express (NVMe), Universal Flash Storage (UFS), etc. The memory controller 40 communicates with the nonvolatile memory device 50 through the nonvolatile memory interface 47.

Figure 3:
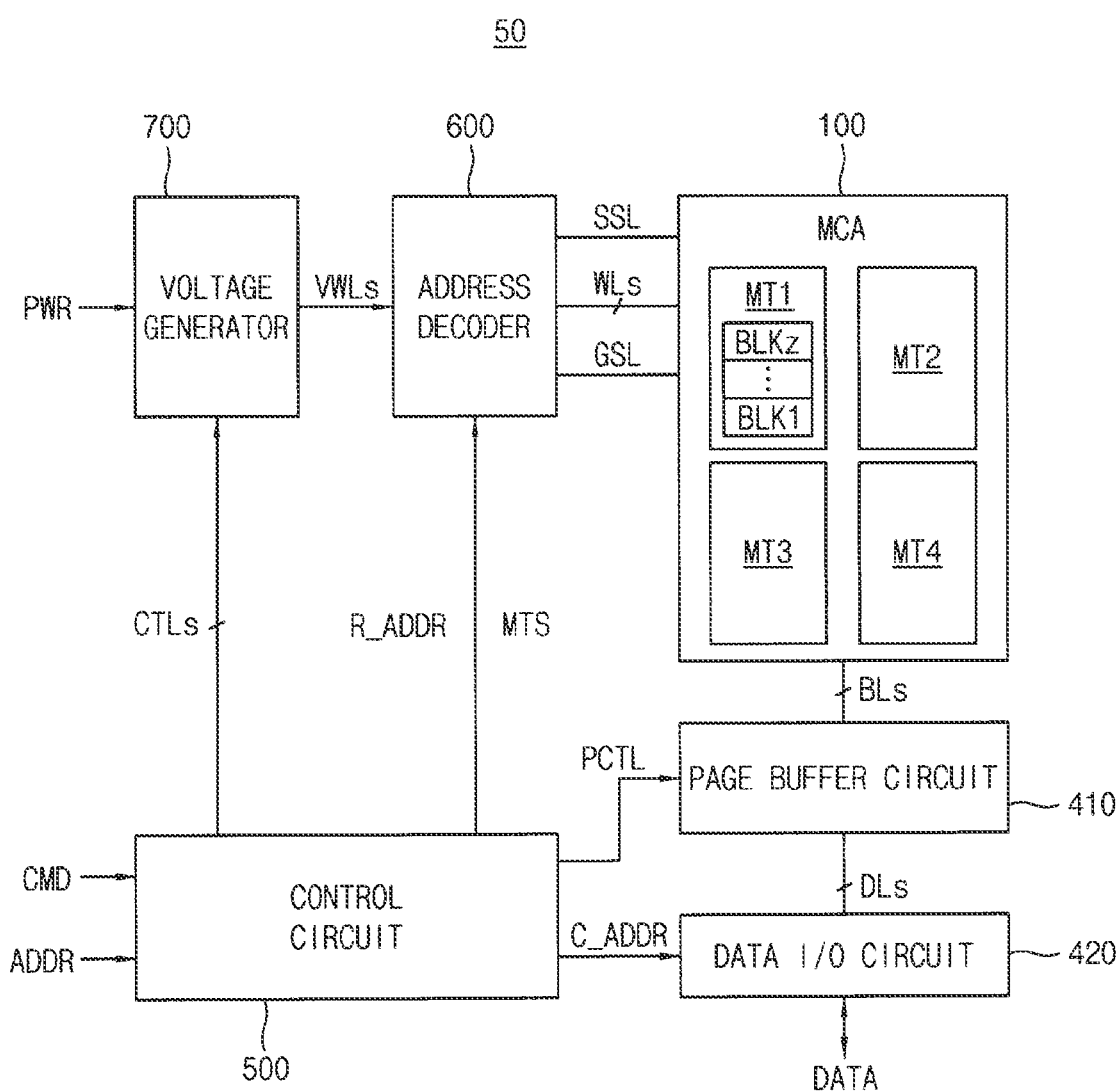
FIG. 3 is a block diagram illustrating a nonvolatile memory device in the storage device of FIG. 1 according to an exemplary embodiment of the inventive concept.

FIG. 3 is a block diagram illustrating a nonvolatile memory device in the storage device of FIG. 1 according to an exemplary embodiment of the inventive concept.

Referring to FIG. 3, the nonvolatile memory device 50 includes the memory cell array 100, an address decoder 600, a page buffer circuit 410, a data input/output (I/O) circuit 420, a control circuit 500, and a voltage generator 700.

The memory cell array 100 may be coupled to the address decoder 600 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include the plurality of mats MT1, MT2, MT3, and MT4 corresponding to different bit-lines. The memory cell array 100 may include a plurality of memory cells coupled to the plurality of word-lines WLs and the plurality of bit-lines BLs. Each of the plurality of mats MT1, MT2, MT3, and MT4 may include a plurality of memory blocks BLK1 through BLKz (where z is an integer greater than two), and each memory block may have a planar structure or a three-dimensional (3D) structure. The memory cell array 100 may include a single-level cell block including single-level cells (SLC), a multi-level cell block including multi-level cells (MLC), a triple-level cell block including triple-level cells (TLC), or a quad-level cell block including quad-level cells (QLC). For example, some memory blocks from among the memory blocks BLK1 through BLKz may be single-level cell blocks, and other memory blocks may be multi-level cell blocks, triple-level cell blocks, or quad-level cell blocks.

In exemplary embodiments of the inventive concept, the memory cell array 100 may include a vertical structure located on an upper substrate. For example, the vertical structure may include a plurality of via areas, and in the via areas, one or more first through-hole vias spaced apart in a second direction are provided. The plurality of mats MT1, MT2, MT3, and MT4 may be formed in a cell region adjacent to a pad region. The plurality of mats MT1, MT2, MT3, and MT4 may include different numbers of via areas according to a distance from the pad region in a first direction crossing (e.g., perpendicular to) the second direction.

The control circuit 500 may receive the command (signal) CMD and the address (signal) ADDR from the memory controller 40, and control an erase operation, a program operation, and a read operation of the nonvolatile memory device 50 based on the command signal CMD and the address signal ADDR.

In exemplary embodiments of the inventive concept, the control circuit 500 may generate control signals CTLs, which are used for controlling the voltage generator 700, based on the command signal CMD, and generate a row address R_ADDR and a column address C_ADDR based on the address signal ADDR. The control circuit 500 may provide the row address R_ADDR to the address decoder 600 and provide the column address C_ADDR to the data input/output circuit 420. The control circuit 500 may also provide the address decoder 600 with a meta signal MTS associated with an attribute of the data to be stored.

The address decoder 600 may transfer voltages to the string selection line SSL, the plurality of word-lines WLs, and the ground selection line GSL for operating memory cells of the memory cell array 100 in response to the address signal ADDR and the command signal CMD received from the memory controller 40 by receiving various word-line voltages VWLs from the voltage generator 700. The voltage generator 700 may provide the word-line voltages VWLs to the address decoder 600 to the memory cell array 100 in response to control signals CTLs received from the control circuit 500. The address decoder 600 may include a first address decoder 601 and a second address decoder 603, which will be described in detail below.

For example, during the program operation, the voltage generator 700 may apply a program voltage to a selected word-line and may apply a program pass voltage to the unselected word-lines. In addition, during a program verification operation, the voltage generator 700 may apply a program verification voltage to the selected word-line and may apply a verification pass voltage to the unselected word-lines. In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. The page buffer circuit 410 may temporarily store data to be programmed in a selected page or data read out from the selected page of the memory cell array 100. The page buffer circuit 410 may include a plurality of page buffers. The page buffer circuit 410 may temporarily store data to be programmed in a selected page and may temporarily store data read from the selected page. The page buffer circuit 410 may be controlled by a control signal PCTL received from the control circuit 500. The page buffer circuit 410 may include a first page buffer circuit 411 and a second page buffer circuit 413, which will be described in detail below.

The data input/output circuit 420 may be coupled to the page buffer circuit 410 through data lines DLs. During the program operation, the data input/output circuit 420 may receive program data DATA (e.g., the data DATA of FIG. 1) from the memory controller 40 and provide the program data DATA to the page buffer circuit 410 based on the column address C_ADDR received from the control circuit 500. During the read operation, the data input/output circuit 420 may provide read data DATA (e.g., the data DATA of FIG. 1), which are stored in the page buffer circuit 410, to the memory controller 40 based on the column address C_ADDR received from the control circuit 500.

Figure 4:
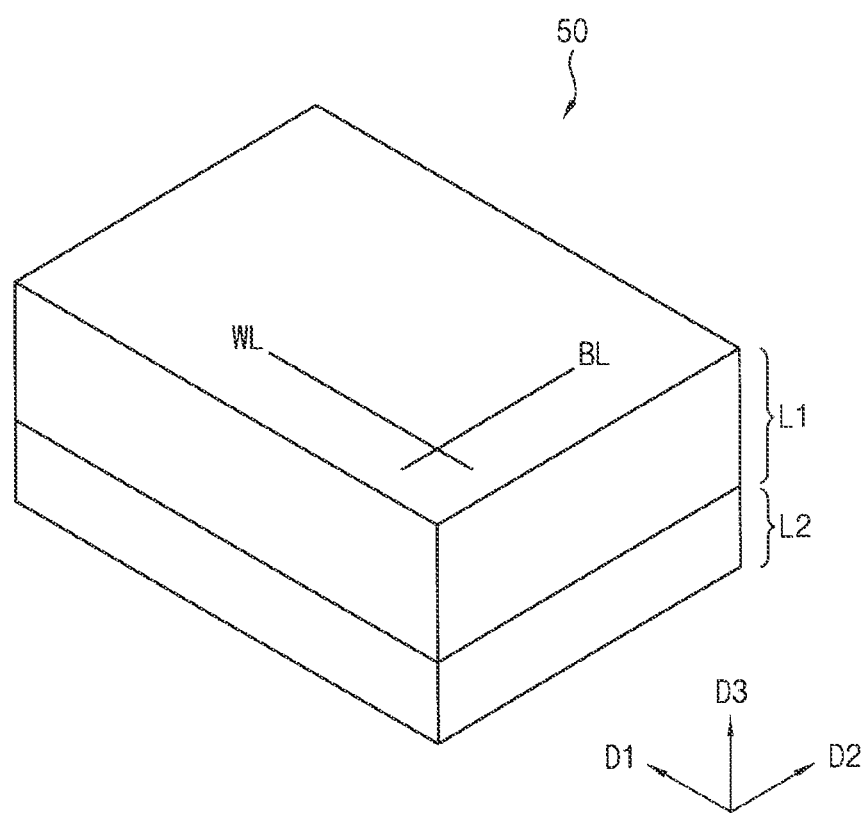
FIG. 4 is a view illustrating a structure of a nonvolatile memory device of FIG. 3 according to an exemplary embodiment of the inventive concept.

FIG. 4 is a view illustrating a structure of the nonvolatile memory device of FIG. 3 according to an exemplary embodiment of the inventive concept.

Hereinafter, D1 denotes a first direction, D2 denotes a second direction crossing the first direction, and D3 denotes a third direction crossing the first and second directions.

Referring to FIG. 4, the nonvolatile memory device 50 may include a first semiconductor layer L1 and a second semiconductor layer L2. The first semiconductor layer L1 may be stacked on the second semiconductor layer L2 in the third direction. In exemplary embodiments of the inventive concept, the memory cell array 100 may be formed on the first semiconductor layer L1, and at least one from among the control circuit 500, the address decoder 600, and the page buffer circuit 410 may be formed on the second semiconductor layer L2. For example, various circuits may be formed on the second semiconductor layer L2 by forming semiconductor elements such as transistors and patterns for wiring the semiconductor elements on a lower substrate of the second semiconductor layer L2.

After the circuits are formed on the second semiconductor layer L2, the first semiconductor layer L1 including the memory cell array 100 may be formed. For example, the first semiconductor layer L1 may include a plurality of upper substrates. The memory cell array 100 may be formed on the first semiconductor layer L1 by forming a plurality of gate conductive layers stacked on each of the upper substrates and a plurality of pillars that pass through the plurality of gate conductive layers and extend in a vertical direction (e.g., the third direction) perpendicular to a top surface of each of the upper substrates. In addition, patterns for electrically connecting the memory cell array 100 (e.g., the word-lines WL and the bit-lines BL) and the circuits formed on the second semiconductor layer L2 may be formed on the first semiconductor layer L1. For example, the word-lines WL may extend in the first direction and may be arranged in the second direction. In addition, the bit-lines BL may extend in the second direction and may be arranged in the first direction.

Accordingly, the nonvolatile memory device 100 may have a cell-on-peri or cell-over-peri (COP) structure in which the control circuit 500, the address decoder 600, the page buffer circuit 410, or various other peripheral circuits and the memory cell array 100 are arranged in a stacked direction (e.g., the third direction).

Figure 5:
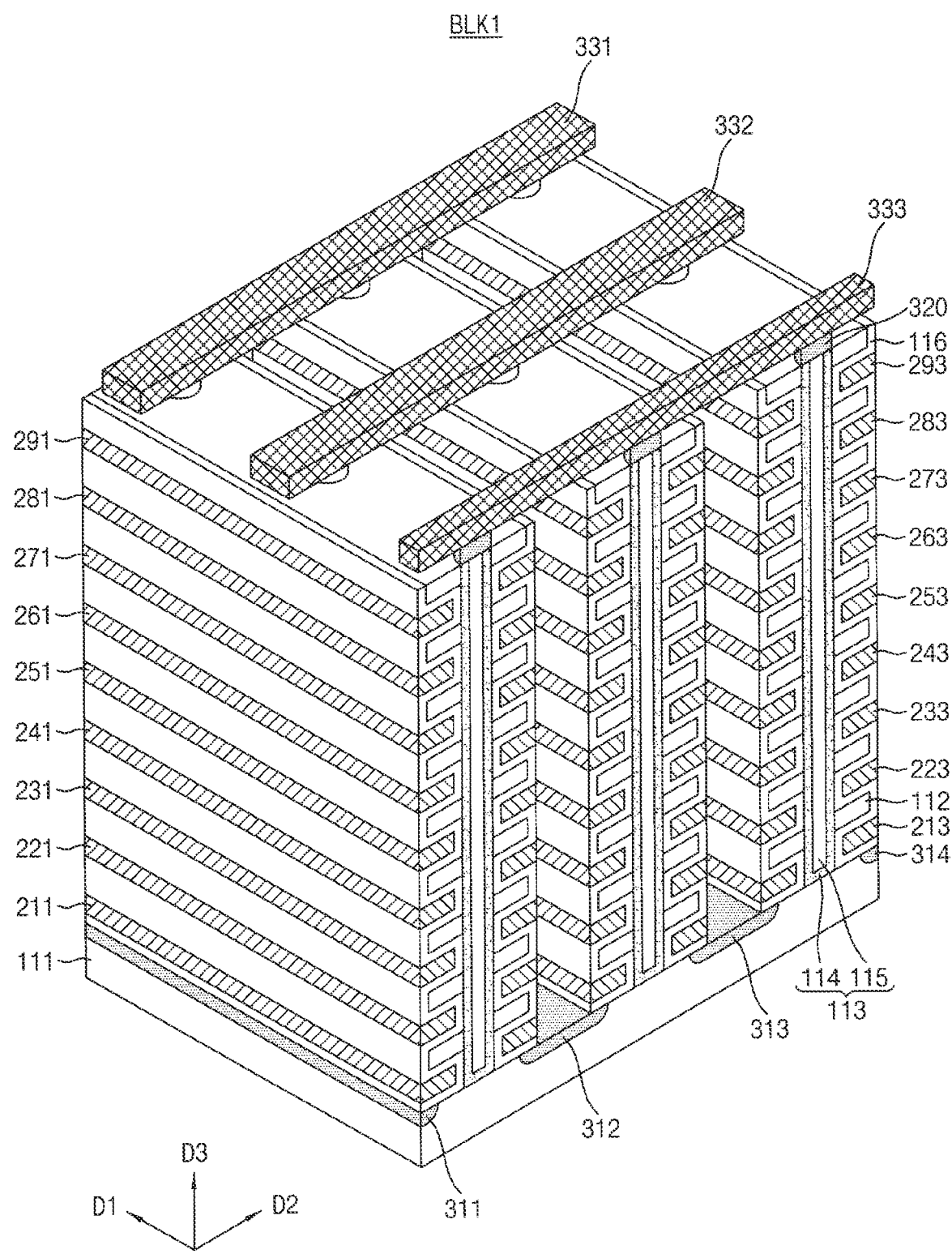
FIG. 5 is a perspective view illustrating a memory block of FIG. 3 according to an exemplary embodiment of the inventive concept.

FIG. 5 is a perspective view illustrating a memory block of FIG. 3 according to an exemplary embodiment of the inventive concept.

Referring to FIG. 5, the memory block BLK1 includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an exemplary embodiment of the inventive concept, the substrate 111 has a p-type well (or a p-type pocket well). However, the conductive type of the substrate 111 is not limited to the p-type.

A plurality of doping regions 311 to 314 extending along the second direction are provided in/on the substrate 111. For example, the plurality of doping regions 311 to 314 may have a second type (e.g., a second conductive type) different from the first type of the substrate 111. In an exemplary embodiment of the inventive concept, the first to fourth doping regions 311 to 314 have an n-type. However, the conductive type of the first to fourth doping regions 311 to 314 is not limited to the n-type.

A plurality of insulation materials 112 extending along the first direction are sequentially provided along the third direction on a region of the substrate 111 between the first and second doping regions 311 and 312. For example, the plurality of insulation materials 112 are provided along the third direction spaced apart by a specific distance. Exemplarily, the insulation materials 112 may include an insulation material such as an oxide layer.

A plurality of pillars 113 penetrating the insulation materials along the third direction D3 are sequentially disposed along the first direction on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having the first type. For example, the channel layer 114 of each pillar 113 may include a silicon material having the same type as the substrate 111. In an exemplary embodiment of the inventive concept, the channel layer 114 of each pillar 113 includes a p-type silicon. However, the channel layer 114 of each pillar 113 is not limited to the p-type silicon.

An inner material 115 of each pillar 113 includes an insulation material. For example, the inner material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the third direction D3 of the last insulation material 112 may be removed.

A plurality of first conductive materials 211 to 291 are provided between the first and second doping regions 311 and 312 on the exposed surfaces of the insulation layer 116. For example, the first conductive material 211 extending along the first direction is provided between the substrate 111 and the insulation material 112 adjacent to the substrate 111.

A first conductive material extending along the second direction is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

Substantially the same structures as those between the first and second doping regions 311 and 312 may be provided in a region between the second and third doping regions 312 and 313. For example, the region between the second and third doping regions 312 and 313 includes a plurality of insulation materials 112 extending along the second direction, a plurality of pillars 113 disposed sequentially along the second direction D2 and penetrating the plurality of insulation materials 112 along the third direction, an insulation layer 116 provided on the exposed surfaces of the plurality of insulation materials 112 and the plurality of pillars 113, and a plurality of first conductive materials 213 to 293 extending along the second direction. The plurality of first conductive materials 213 to 293 between the second and third doping regions 312 and 313 may be similar to the first conductive materials 211 to 291 between the first and second doping regions 311 and 312.

In a region between the third and fourth doping regions 313 and 314, substantially the same structures as those on the first and second doping regions 311 and 312 may be provided. The region between the third and fourth doping regions 313 and 314 includes a plurality of insulation materials 112 extending along the second direction, a plurality of pillars 113 disposed sequentially along the second direction and penetrating the plurality of insulation materials 112 along the third direction, an insulation layer 116 provided on the exposed surfaces of the plurality of insulation materials 112 and the plurality of pillars 113, and a plurality of first conductive materials 213 to 293 extending along the second direction. The plurality of first conductive materials 213 to 293 between the third and fourth doping regions 313 and 314 may be similar to the first conductive materials 211 to 291 between the first and second doping regions 311 and 312

Drains 320 are provided on the plurality of pillars 113. On the drains 320, second conductive materials 331 to 333 extending along the second direction are provided. The second conductive materials 331 to 333 are disposed along the first direction, spaced apart by a specific distance. The second conductive materials 331 to 333 are respectively connected to the drains 320 in a corresponding region. The drains 320 and the second conductive materials 331 to 333 extending along the second direction may be connected through contact plugs.

Figure 6:
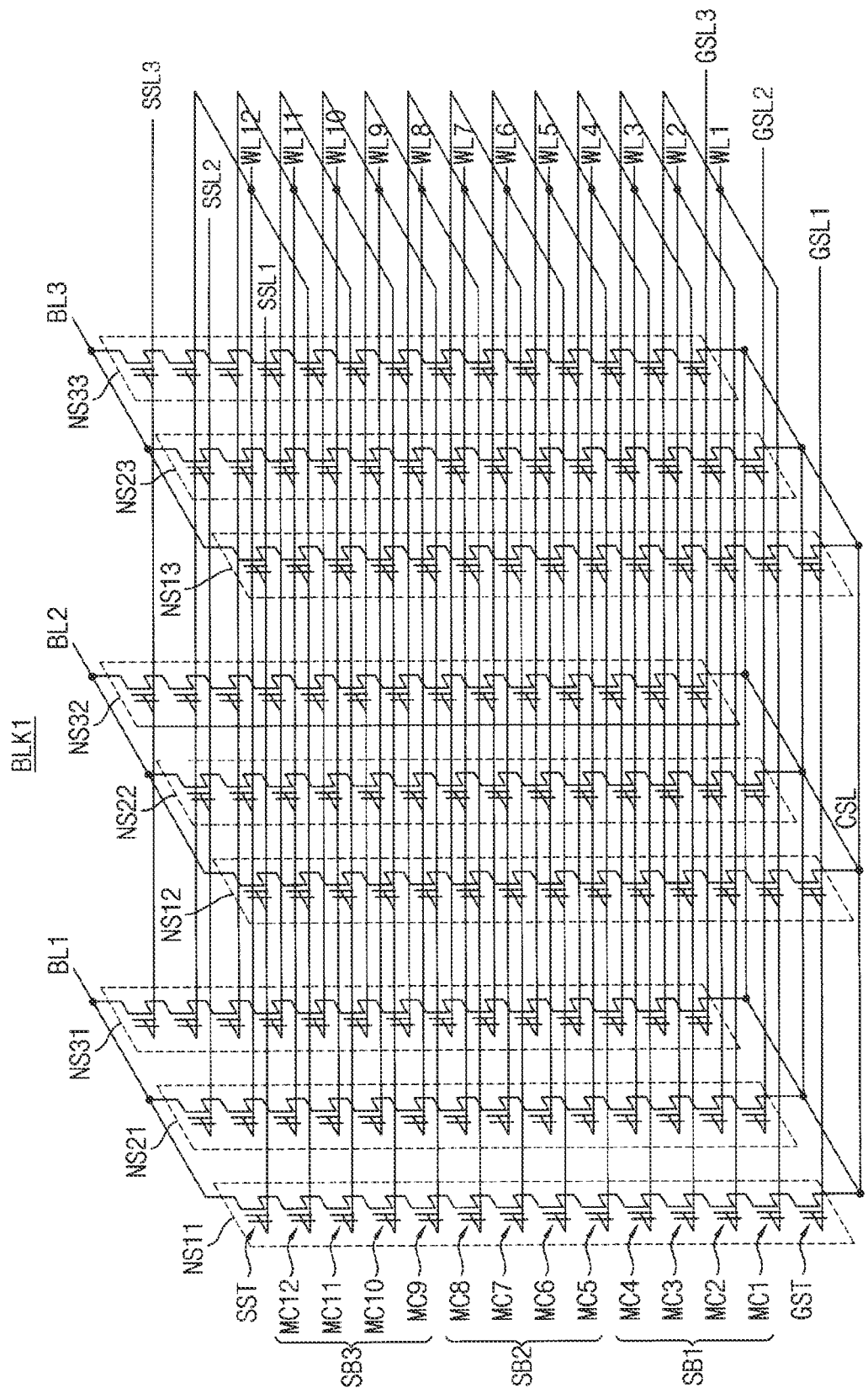
FIG. 6 is an equivalent circuit diagram illustrating the memory block of FIG. 5 according to an exemplary embodiment of the inventive concept.

FIG. 6 is an equivalent circuit diagram illustrating the memory block of FIG. 5 according to an exemplary embodiment of the inventive concept.

The memory block BLK1 of FIG. 6 may be formed on a substrate in a three-dimensional structure (or a vertical structure). For example, a plurality of memory cell strings included in the memory block BLK1 may be formed in a direction perpendicular to the substrate.

Figure 7:
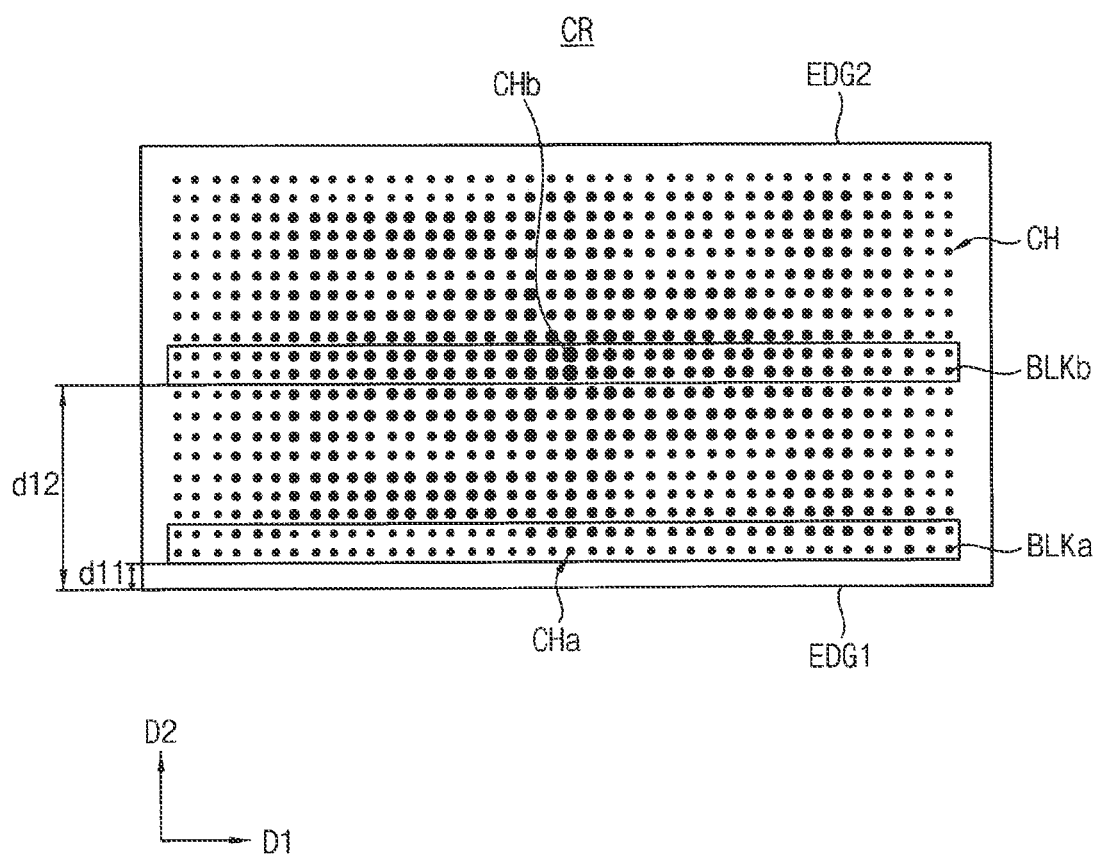
FIG. 7 illustrates a cell region in which a memory cell array of FIG. 3 is formed according to an exemplary embodiment of the inventive concept.

Referring to FIG. 6, the memory block BLK1 may include memory cell strings NS11 to NS33 coupled between bit-lines BL1, BL2, and BL3 and a common source line CSL. Each of the memory cell strings NS11 to NS33 may include a string selection transistor SST, a plurality of memory cells MC1 to MC12, and a ground selection transistor GST. In FIG. 7, each of the memory cell strings NS11 to NS33 is illustrated to include twelve memory cells MC1 to MC12. However, the inventive concept is not limited thereto. In exemplary embodiments of the inventive concept, each of the memory cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2, and BL3, and the ground selection transistor GST may be connected to the common source line CSL.

In exemplary embodiments of the inventive concept, dummy memory cells connected to a dummy word-line may be coupled between the string selection transistor SST and the memory cell MC12 and/or coupled between the ground selection transistor GST and the memory cell MC1. For example, dummy memory cells may be substantially simultaneously formed with normal memory cells with the same processes. A dummy memory cell may be activated by a dummy word-line, but may not have any "data" stored to read from an external device. For instance, data stored in a dummy memory cell electrically connected to a dummy word-line may not be transmitted outside of the memory cell array through selection signals provided by a column decoder, as is the case for normal memory cells. For instance, a dummy memory cell electrically connected to a dummy word-line may not have any connection to a bit line to transmit data therebetween as with normal memory cells.

Word-lines (e.g., WL1) having substantially the same height may be commonly connected, and the ground selection lines GSL1 to GSL3 and the string selection lines SSL1 to SSL3 may be separated. In FIG. 7, the memory block BLK1 is illustrated to be coupled to twelve word-lines WL1 to WL12 and three bit-lines BL1 to BL3. However, the inventive concept is not limited thereto. In exemplary embodiments of the inventive concept, the memory cell array 100 may be coupled to any number of word-lines and bit-lines.

According to exemplary embodiments of the inventive concept, the memory block BLK1 is divided into a plurality of sub-blocks, indicated by representative sub-blocks SB1, SB2, and SB3, each sub-block being smaller in size than the memory block BLK1. The sub-blocks SB1, SB2, and SB3 may be divided in a word-line direction, as shown in FIG. 6. Alternatively, the sub-blocks SB1, SB2, and SB3 may be divided on the basis of bit-lines or string selection lines. The sub-blocks SB1, SB2, and SB3 in the memory block BLK1 may be erased independently regardless of the reference used to divide the memory block BLK1 into sub-blocks.

FIG. 7 illustrates a cell region in which a memory cell array of FIG. 3 is formed according to an exemplary embodiment of the inventive concept.

Referring to FIG. 7, a cell region CR includes a plurality of channel holes CH.

A channel hole size, for example, a channel hole diameter, may be varied according to positions within the cell region CR. For example, channel holes CH adjacent to first and second edges EDG1 and EDG2 have a low peripheral density, and thus may have a different diameter from those of other channel holes CH. A memory block BLKa may be adjacent to the first edge EDG1, and may be spaced apart from the first edge EDG1 by a first distance d11. A memory block BLKb may not be adjacent to the first and second edges EDG1 and EDG2, and may be in a center of the cell region CR, and may be spaced apart from the first edge EDG1 by a second distance d12. The second distance d12 may be greater than the first distance d11. A first diameter DA1 of a first channel hole CHa included in the memory block BLKa may be smaller than a second diameter DA2 of a second channel hole CHb included in the memory block BLKb.

Figure 8A:
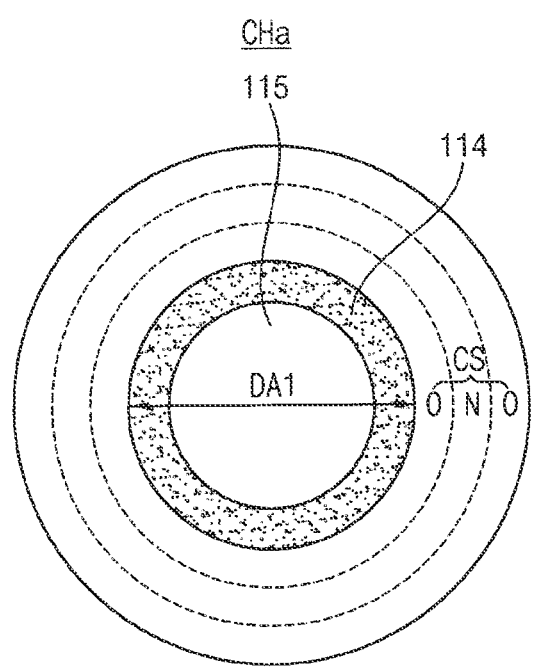
FIGS. 8A and 8B illustrate cross-sections of strings of memory blocks of FIG. 7, according to exemplary embodiments of the inventive concept.
Figure 8B:
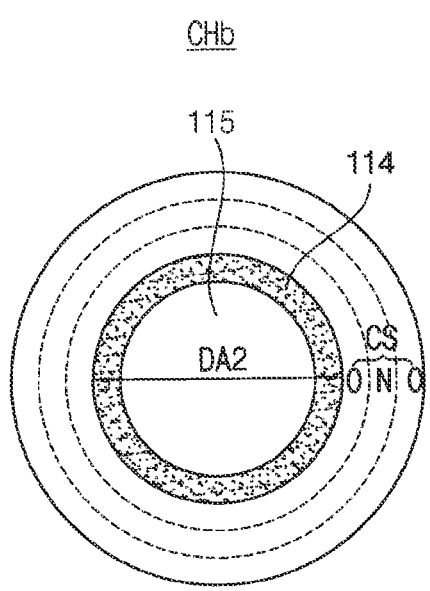

FIGS. 8A and 8B illustrate cross-sections of strings of memory blocks of FIG. 7, according to exemplary embodiments of the inventive concept.

Referring to FIG. 8A, a pillar including the channel layer 114 and the internal layer 115 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 8B, a pillar including the channel layer 114 and the internal layer 115 may be formed in the second channel hole CHb included in the memory block BLKb, and a charge storage layer CS may be formed around the second channel hole CHb, and the charge storage layer CS may have an ONO structure.

In an exemplary embodiment of the inventive concept, a thickness of the charge storage layer CS included in the memory block BLKb may be different from a thickness of the charge storage layer CS included in the memory block BLKa. Characteristics of memory cells may vary due to the difference in the channel hole diameters. For example, in a 3D memory device having a gate-all-around structure in which a gate electrode is disposed around a circumference of a channel hole, if a channel hole diameter is reduced, the magnitude of an electric field formed between a gate electrode and the channel layer 114 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 7, a memory block is formed in the cell region CR to include all memory cells corresponding to one page in the first direction, e.g., in a word-line direction, and to include some strings in the second direction, e.g., in a bit-line direction. Thus, each memory block extends in the first direction, and channel hole sizes, e.g., channel hole diameters may differ in units of memory blocks. Thus, program and erase speeds of memory cells included in the memory block BLKa may be higher than program and erase speeds of memory cells included in the memory block BLKb.

Figure 9:
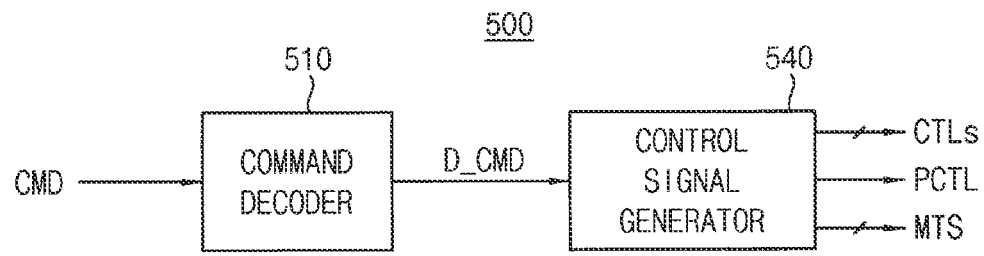
FIG. 9 is a block diagram illustrating a control circuit in the nonvolatile memory device of FIG. 3 according to an exemplary embodiment of the inventive concept.
Figure 9:
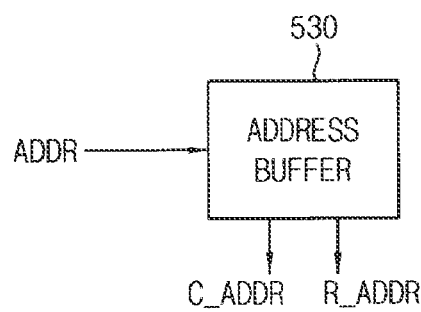

FIG. 9 is a block diagram illustrating a control circuit in the nonvolatile memory device of FIG. 3 according to an exemplary embodiment of the inventive concept.

Referring to FIG. 9, the control circuit 500 may include a command decoder 510, an address buffer 530, and a control signal generator 540.

The command decoder 510 decodes the command CMD and provides a decoded command D_CMD to the control signal generator 540. The address buffer 530 receives the address signal ADDR, provides the row address R_ADDR to the row decoder 600, and provides the column address C_ADDR to the data input/output circuit 420

The control signal generator 540 receives the decoded command D_CMD, generates the control signals CTLs, the meta signal MTS, and the control signal PCTL based on the operation directed by the decoded command D_CMD, provides the control signals CTLs to the voltage generator 700, provides the control signal PCTL to the page buffer circuit 410, and provides the meta signal MTS to the address decoder 600. The decoded command D_CMD may include meta information associated with attributes of the data DATA, and the meta signal MTS may include the meta information. The memory controller 40 may incorporate the meta information in the command CMD based on access frequency of the data DATA. The data DATA may be divided into cold data and hot data. The hot data is accessed with a first frequency greater than a reference frequency during a reference time interval, and the cold data is accessed with a second frequency less than or equal to the reference frequency during the reference time interval.

Figure 10:
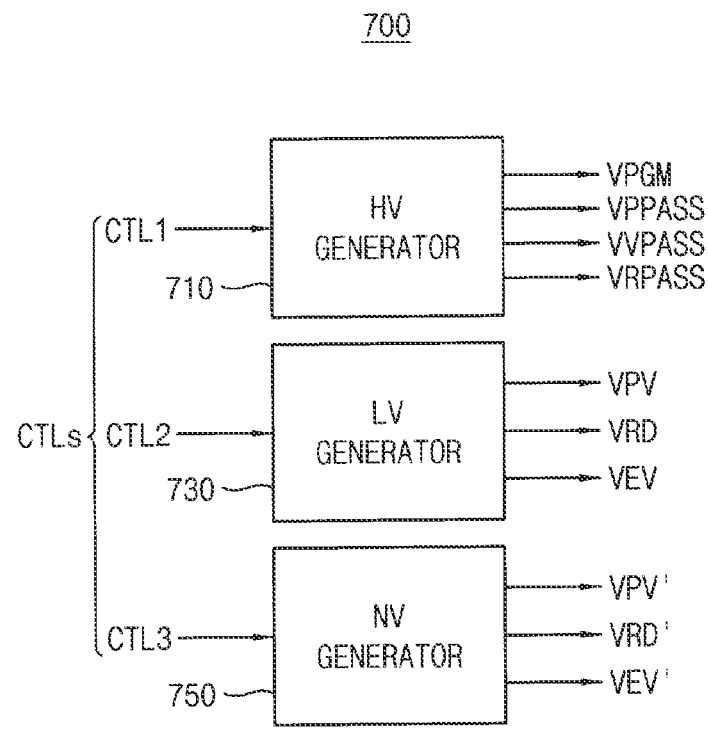
FIG. 10 is a block diagram illustrating a voltage generator in the nonvolatile memory device of FIG. 3 according to an exemplary embodiment of the inventive concept.

FIG. 10 is a block diagram illustrating a voltage generator in the nonvolatile memory device of FIG. 3 according to an exemplary embodiment of the inventive concept.

Referring to FIG. 10, the voltage generator 700 may include a high voltage generator 710, and a low voltage generator 730. The voltage generator 700 may further include a negative voltage generator 750.

The high voltage generator 710 may generate a program voltage VPGM, a program pass voltage VPPASS, a verification pass voltage VVPASS, and a read pass voltage VRPASS according to operations directed by the command CMD, in response to a first control signal CTL1 of the control signals CTLs. The program voltage VPGM is applied to the selected word-line, the program pass voltage VPPASS, the verification pass voltage VVPASS, and the read pass voltage VRPASS may be applied to the unselected word-lines. The first control signal CTL1 may include a plurality of bits which indicate the operations directed by the command CMD.

The low voltage generator 730 may generate a program verification voltage VPV, a read voltage VRD, and an erase verification voltage VEV according to operations directed by the command CMD, in response to a second control signal CTL2 of the control signals CTLs. The program verification voltage VEV, the read voltage VRD, and the erase verification voltage VEV may be applied to the selected word-line according to operation of the nonvolatile memory device 50. The second control signal CTL2 may include a plurality of bits which indicate the operations directed by the command CMD.

The negative voltage generator 750 may generate a program verification voltage VPV', a read voltage VRD', and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

Figure 11:
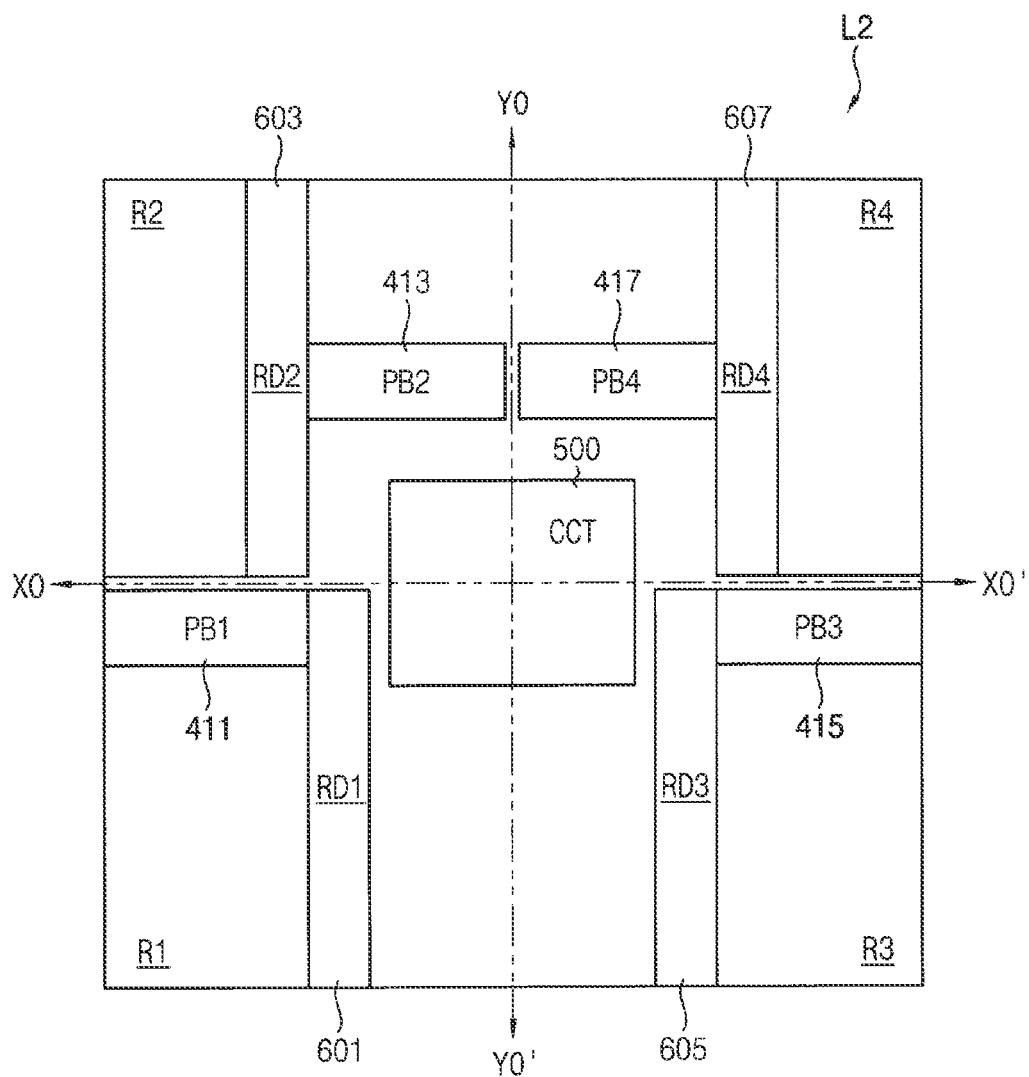
FIG. 11 is a plan view illustrating an upper surface of a second semiconductor layer in FIG. 4 according to an exemplary embodiment of the inventive concept.

FIG. 11 is a plan view illustrating an upper surface of a second semiconductor layer in FIG. 4 according to an exemplary embodiment of the inventive concept.

Referring to FIGS. 3, 4, and 11, the second semiconductor layer L2 may be divided into first through fourth regions R1 through R4 by a first virtual line X0-X0' in the first direction substantially parallel to the word-lines WL and a second virtual line Y0-Y0' in the second direction substantially parallel to the bit-lines BL. In other words, the first through fourth regions R1 through R4 are divided along the first and second directions intersecting at a point overlapping the memory cell array 100 in the third direction.

The first mat MT1 may be disposed in an upper portion of the first region R1, the second mat MT2 may be disposed in an upper portion of the second region R2, the third mat MT3 may be disposed in an upper portion of the third region R3, and the fourth mat MT4 may be disposed in an upper portion of the fourth region R4.

A first address decoder 601 and a first page buffer circuit 411 may be disposed in the first region R1 and may be electrically connected to the first mat MT1. A second address decoder 603 and a second page buffer circuit 413 may be disposed in the second region R2 and may be electrically connected to the second mat MT2. A third address decoder 605 and a third page buffer circuit 415 may be disposed in the third region R3 and may be electrically connected to the third mat MT3. A fourth address decoder 607 and a fourth page buffer circuit 417 may be disposed in the fourth region R4 and may be electrically connected to the fourth mat MT4. In FIG. 11, it is illustrated that one address decoder and one page buffer circuit are disposed in each of the first to fourth regions R1 to R4, but the inventive concept is not limited thereto. In exemplary embodiments of the inventive concept, a plurality of address decoders and a plurality of page buffer circuits may be disposed in each of the first to fourth regions R1 to R4.

The control circuit (CCT) 500 may be disposed in a certain region of the second semiconductor layer L2. The control circuit 500 may be connected to the first to fourth address decoders 601, 603, 605, and 607 and to the first to fourth page buffer circuit 411, 413, 415, and 417. In FIG. 11, the control circuit 500 is illustrated as being disposed in the center region of the second semiconductor layer L2, but the inventive concept is not limited thereto. In exemplary embodiments of the inventive concept, the control circuit 500 may be disposed in at least one of the first through fourth regions R1 through R4.

Figure 12:
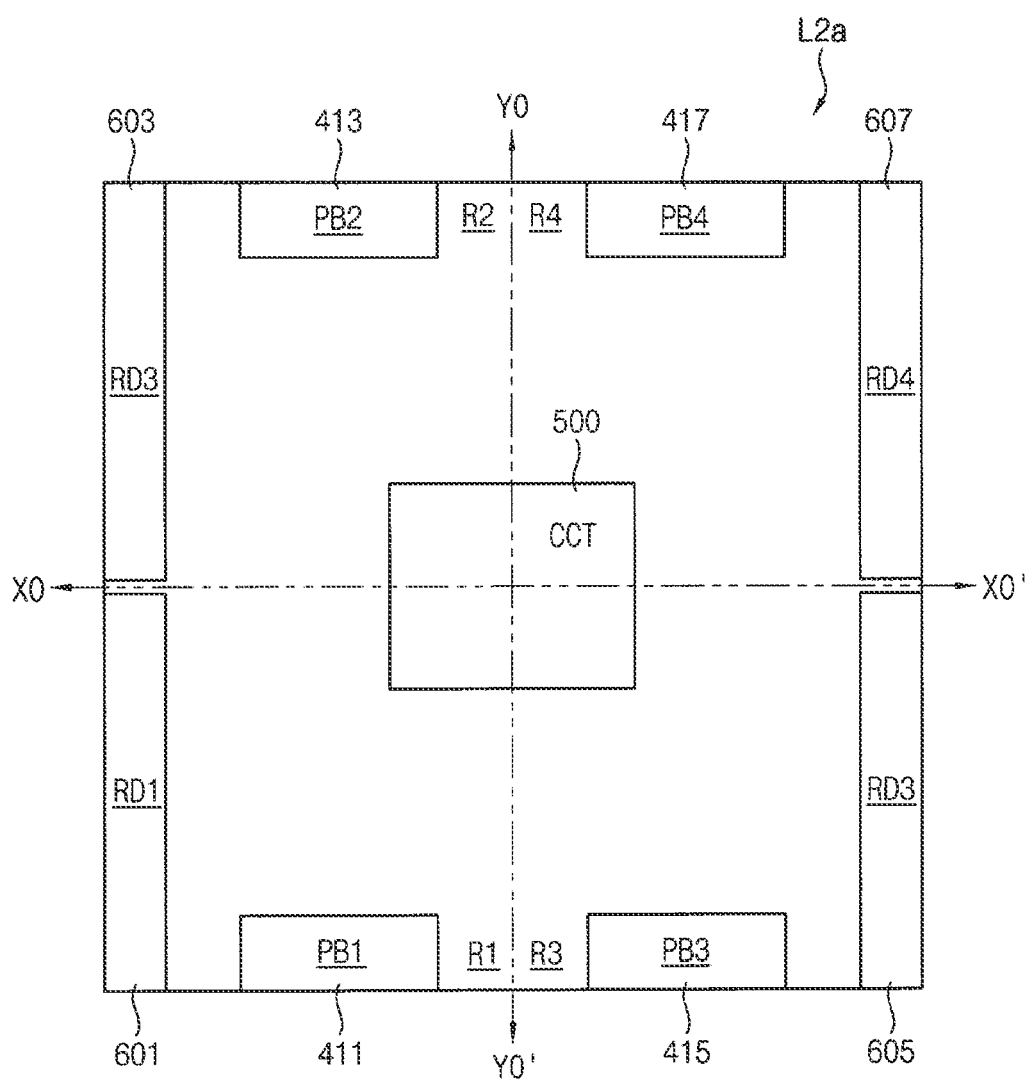
FIG. 12 is a plan view illustrating an upper surface of the second semiconductor layer in FIG. 4 according to an exemplary embodiment of the inventive concept.
Figure 12:
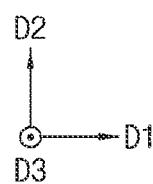

FIG. 12 is a plan view illustrating an upper surface of the second semiconductor layer in FIG. 4 according to an exemplary embodiment of the inventive concept.

Referring to FIGS. 3, 4, and 12, a second semiconductor layer L2a may be divided into the first through fourth regions R1 through R4 by the first virtual line X0-X0' in the first direction substantially parallel to the word-lines WL and the second virtual line Y0-Y0' in the second direction substantially parallel to the bit-lines BL.

FIG. 12 differs from FIG. 11 in that each of the first to fourth address decoders 601, 603, 605, and 607 and each of the first to fourth page buffer circuit 411, 413, 415, and 417 are disposed adjacent to edge portions of a respective one of the first to fourth regions R1 to R4.

Figure 13:
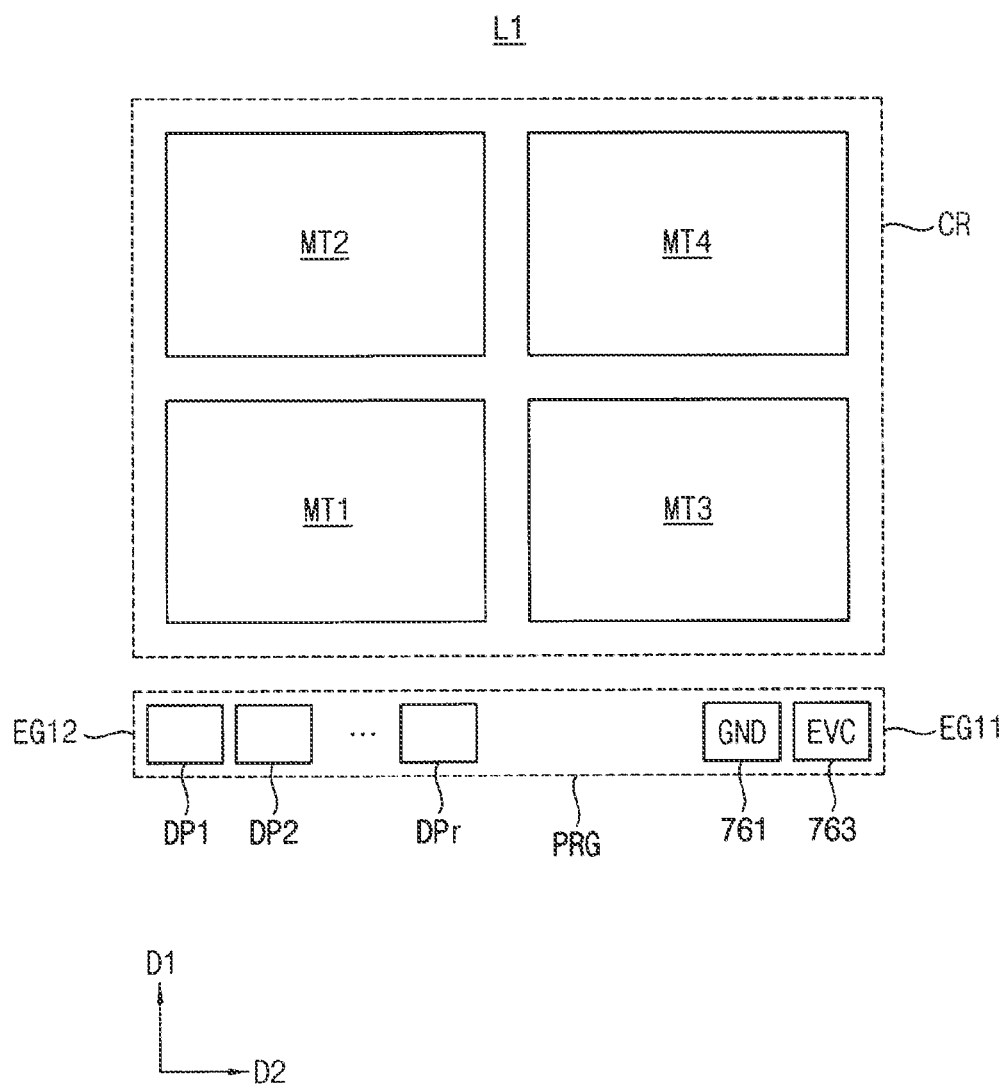
FIG. 13 is a view illustrating a first semiconductor layer in FIG. 4 according to an exemplary embodiment of the inventive concept.

FIG. 13 is a view illustrating a first semiconductor layer in FIG. 4 according to an exemplary embodiment of the inventive concept.

Referring to FIGS. 3, 4, and 13, the first semiconductor layer L1 may include the cell region CR and a pad region PRG which are adjacent to each other in the first direction.

The memory cell array 100 in FIG. 3 may be disposed in the cell region CR and the cell region CR may include the plurality of mats MT1, MT2, MT3, and MT4.

The pad region may include a plurality of input/output (I/O) pads DP1~DPr and at least one power pad, e.g., power pads 761 and 763. A ground voltage GND may be provided to the mats MT1, MT2, MT3, and MT4 through the power pad 761 and a power supply voltage EVC may be provided to the mats MT1, MT2, MT3, and MT4 through the power pad 763. The plurality of I/O pads DP1~DPr may be disposed in the second direction between a first edge portion EG11 and a second edge portion EG12 of the pad region PRG, and the power pads 761 and 763 may be disposed adjacent to the first edge portion EG11.

Figure 14:
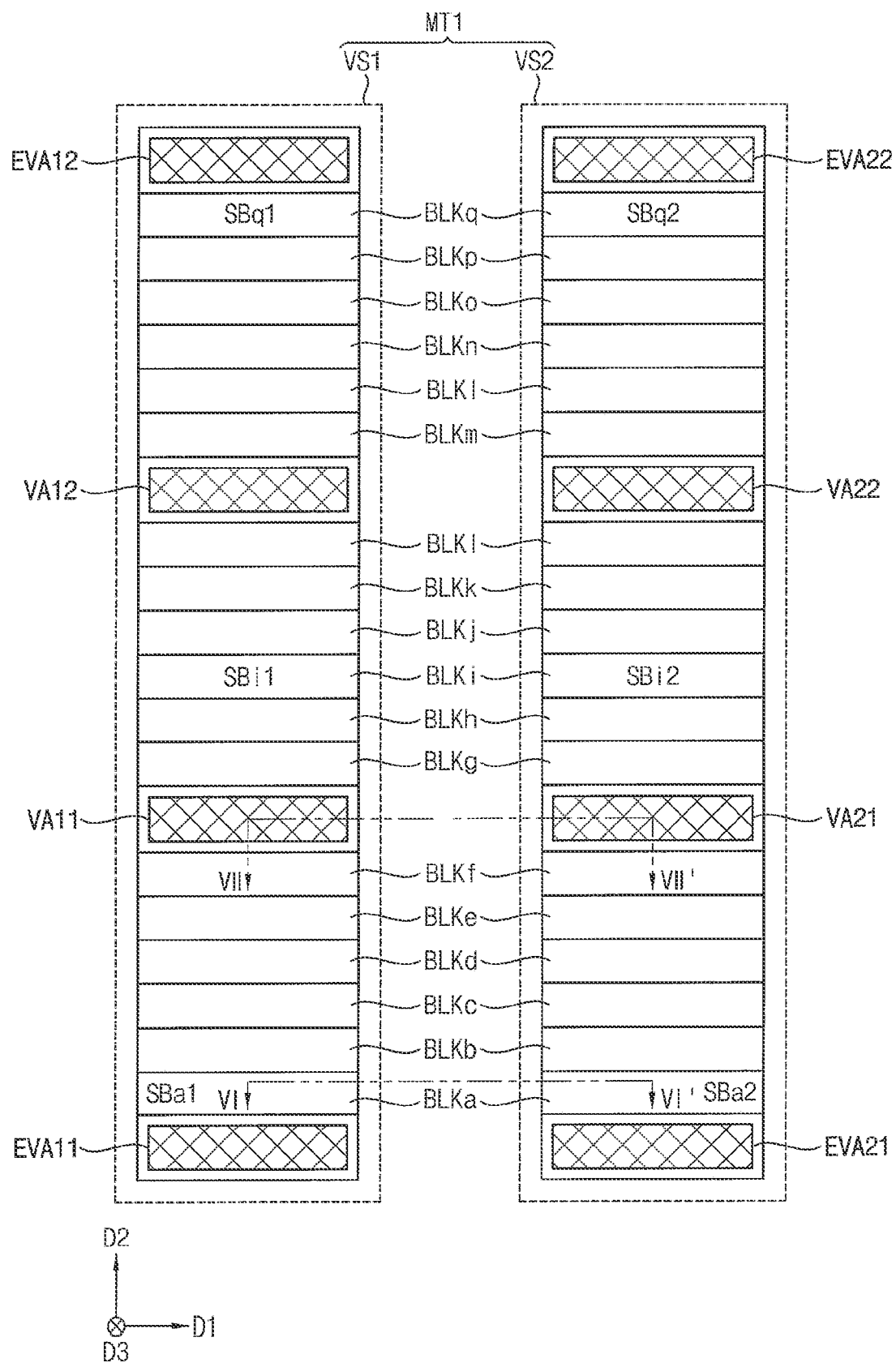
FIG. 14 illustrates a first mat in FIG. 13 according to an exemplary embodiment of the inventive concept.

FIG. 14 illustrates a first mat in FIG. 13 according to an exemplary embodiment of the inventive concept.

Referring to FIGS. 13 and 14, the first mat MT1 may be located on the first semiconductor layer L1, and the first mat MT1 may include a first vertical structure VS1 and a second vertical structure VS2. As shown in FIG. 14, the first mat MT1 may include a plurality of memory blocks BLKa~BLKq formed as the first and second vertical structures VS1 and VS2. The memory blocks BLK1~BLKq may be arranged in the second direction. Each of the memory blocks BLKa~BLKq may include a first sub-block and a second sub-block. The memory block BLKa includes a first sub-block SBa1 and a second sub-block SBa2. The memory block BLKi includes a first sub-block SBi1 and a second sub-block SBi2. The memory block BLKq includes a first sub-block SBq1 and a second sub-block SBq2.

As shown in FIG. 14, the first vertical structure VS1 may include a plurality of first sub-blocks of the memory blocks BLKa~BLKq and a plurality of first via areas EVA11, VA11, VA12, and EVA12 which are spaced apart in the second direction. In addition, the second vertical structure VS2 may include a plurality of second sub-blocks of the memory blocks BLKa~BLKq and a plurality of second via areas EVA21, VA21, VA22, and EVA22 which are spaced apart in the second direction. The first sub-blocks may be arranged among the first via areas EVA11, VA11, VA12, and EVA12, and the second sub-blocks may be arranged among the second via areas EVA21, VA21, VA22, and EVA22.

The first via areas EVA11 and EVA12 adjacent to edges in the second direction and in the first sub-blocks may be referred to as first and second edge via areas, respectively. The first via areas EVA21 and EVA22 adjacent to edges in the second direction and in the second sub-blocks may be referred to as third and fourth edge via areas, respectively.

For example, in the first via areas VA11 and VA12, one or more first through-hole vias that each pass through the first vertical structure VS1 and are connected to the first page buffer circuit 411 may be formed. In addition, in the second via areas VA21 and VA22, one or more second through-hole vias that each pass through the second vertical structure VS22 and are connected to the second page buffer circuit 413 may be formed.

For example, in the first and second edge via areas EVA11 and EVA12, one or more edge through-hole vias that each pass through the first vertical structure VS1 and are connected to the first address decoder 601 may be formed. In addition, in the third and fourth edge via areas EVA21 and EVA22, one or more edge through-hole vias that each pass through the second vertical structure VS22 and are connected to the second address decoder 603 may be formed.

Figure 15:
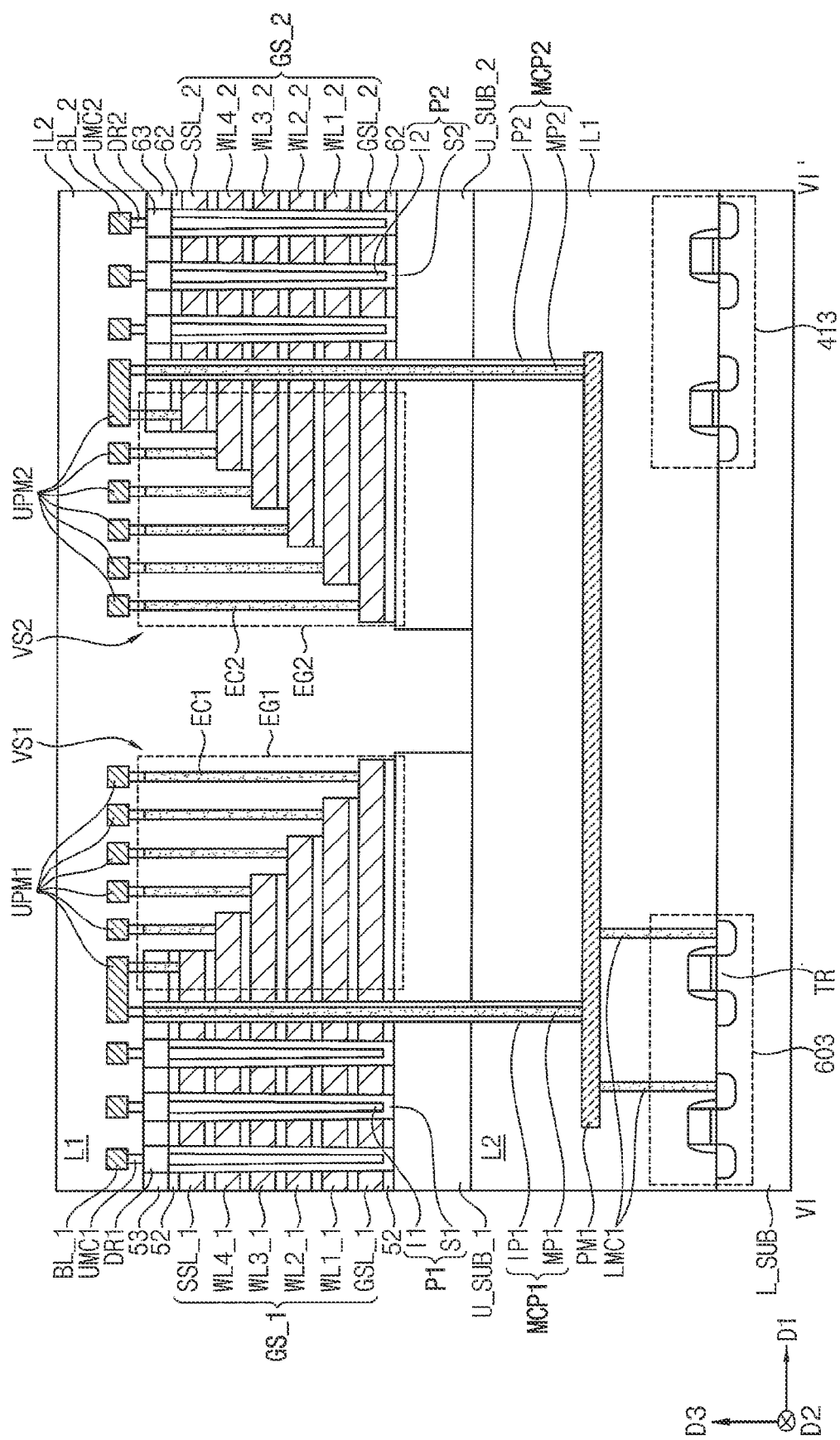
FIG. 15 is a cross-sectional view taken along line VI-VI' of FIG. 14 according to an exemplary embodiment of the inventive concept.

FIG. 15 is a cross-sectional view taken along line VI-VI' of FIG. 14 according to an exemplary embodiment of the inventive concept. For example, FIG. 15 is a cross-sectional view taken along line VI-VI' of FIG. 14, illustrating configurations of the first and second semiconductor layers.

Referring to FIG. 15, the second semiconductor layer L2 may include a lower substrate L_SUB, and the second address decoder 603 and the second page buffer circuit 413 formed on the lower substrate L_SUB. In addition, the second semiconductor layer L2 may include a plurality of first lower contacts LMC1 electrically connected to the second address decoder 603, a first lower conductive line PM1 electrically connected to the plurality of first lower contacts LMC1, and a lower insulating layer IL1 covering the plurality of first lower contacts LMC1 and the first lower conductive line PM1.

The second address decoder 603 and the second page buffer circuit 413 may be formed on portions of the lower substrate L_SUB. In other words, the second address decoder 603 and/or the second page buffer circuit 413 may be formed by forming a plurality of transistors TR on the lower substrate L_SUB.

The first semiconductor layer L1 may include a first upper substrate U_SUB_1, a second upper substrate U_SUB_2, the first vertical structure VS1 located on the first upper substrate U_SUB_1, and the second vertical structure VS2 located on the second upper substrate U_SUB_2. In addition, the first semiconductor layer L1 may include a plurality of first upper contacts UMC1, a plurality of first bit-lines BL_1, a plurality of first edge contacts EC1, and a plurality of first upper conductive lines UPM1 which are electrically connected to the first vertical structure VS1. In addition, the first semiconductor layer L1 may include a plurality of second upper contacts UMC2, a plurality of second bit-lines BL_2, a plurality of second edge contacts EC2, and a plurality of second upper conductive lines UPM2 which are electrically connected to the second vertical structure VS2. In addition, the first semiconductor layer L1 may include an upper insulating layer IL2 covering the first and second vertical structures VS1 and VS2 and various conductive lines.

The first and second upper substrates U_SUB_1 and U_SUB_2 may be support layers that respectively support first and second gate conductive layers GS_1 and GS_2. The first and second upper substrates U_SUB_1 and U_SUB_2 may be, for example, base substrates.

The first vertical structure VS1 may include the first gate conductive layers GS_1 located on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word-lines WL1_1 through WL4_1, and a string selection line SSL_1. The ground selection line GSL_1, the word-lines WL1_1 through WL4_1, and the string selection line SSL_1 may be sequentially formed on the first upper substrate U_SUB_1, and an insulating layer 52 may be located under or over each of the first gate conductive layers GS_1.

Each of the plurality of pillars P1 may include a surface layer S1 and an inside I1. For example, the surface layer S1 of each of the pillars P1 may include a silicon material doped with an impurity, or a silicon material not doped with an impurity.

For example, the ground selection line GSL_1 and a portion of the surface layer S1 adjacent to the ground selection line GSL_1 may constitute the ground selection transistor GST (see FIG. 6). In addition, the word-lines WL1_1 through WL4_1 and a portion of the surface layer S1 adjacent to the word-lines WL1_1 through WL4_1 may constitute the memory cells MC1~MC8 (see FIG. 6). In addition, the string selection line SSL_1 and a portion of the surface layer S1 adjacent to the string selection line SSL_1 may constitute the string selection transistor SST (see FIG. 6).

A drain region DR1 may be formed on the pillar P1. For example, the drain region DR1 may include a silicon material doped with an impurity. An etch-stop film 53 may be formed on a side wall of the drain region DR1.

The first vertical structure VS1 may include an edge region EG1. As shown in FIG. 15, a cross-section of the edge region EG1 may form a stepped pad structure. The stepped pad structure may be referred to as a "word line pad". The plurality of first edge contacts EC1 may be connected to the edge region EG1, and an electrical signal may be applied from a peripheral circuit such as the second address decoder 603 through the first edge contacts EC1. For example, a contact plug MCP1 that passes through the first vertical structure VS1, the first upper substrate U_SUB_1, and a part of the second semiconductor layer L2 may have one side connected to the first lower conductive line PM1 and the other side electrically connected to the edge region EG1 through the first upper conductive lines UPM1. The contact plug MCP1 may include an insulating film pattern IP1 and a conductive pattern MP1.

At least some of the first edge contacts EC1 may pass through parts of the first and second semiconductor layers L1 and L2 in the third direction between the first and second upper substrates U_SUB_1 and U_SUB_2 and may have one side electrically connected to a contact plug (e.g., MCP1) connected to the lower conductive line (e.g., PM1).

Since the first and second vertical structures VS1 and VS2 have corresponding configurations in the cross-sectional view taken along line VI-VI' of the first memory block BLK1 of FIG. 15, a repeated explanation of elements of the second vertical structure VS2 corresponding to those of the first vertical structure VS1 may not be given.

The second vertical structure VS2 may include a plurality of pillars P2 that pass through the second gate conductive layers GS_2. Each of the pillars P2 may include a surface layer S2 and an inside 12. The second gate conductive layers GS_2 may include a ground selection line GSL_2, word lines WL1_2 through WL4_2, and a string selection line SSL_2. An insulating layer 62 may be located under or over each of the second gate conductive layers GS_2.

A drain region DR2 may be formed on the pillar P2. An etch-stop film 63 may be formed on a side wall of the drain region DR2. The second vertical structure VS2 may include an edge region EG2. A contact plug MCP2 that passes through the second vertical structure VS2, the second upper substrate U_SUB_2, and a part of the second semiconductor layer L2 may have one side connected to the first lower conductive line PM1 and the other side electrically connected to the edge region EG2 through the second upper conductive lines UPM2. The contact plug MCP2 may include an insulating film pattern IP2 and a conductive pattern MP2.

Figure 16:
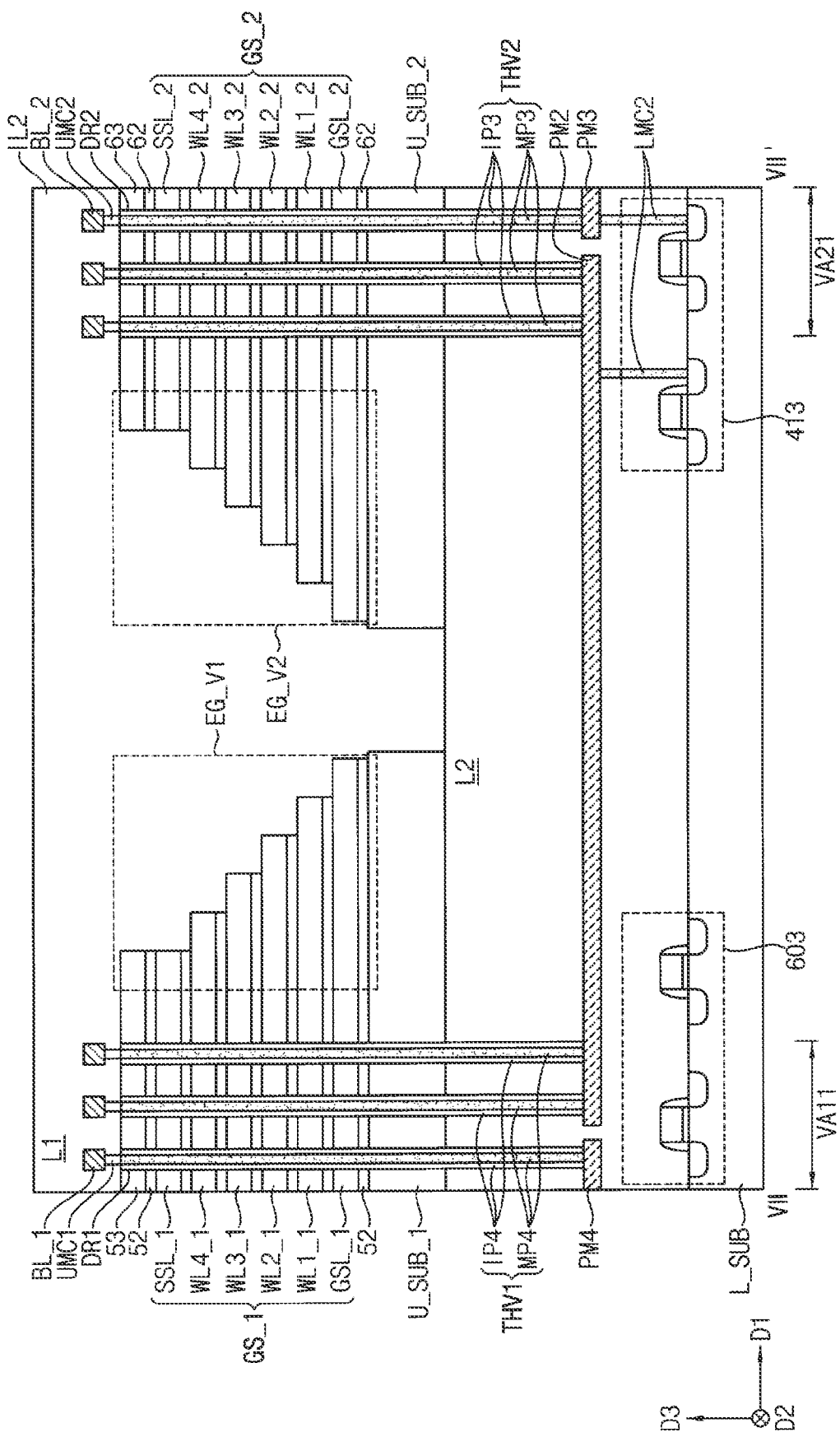
FIG. 16 is a cross-sectional view taken along line VII-VII' of FIG. 14, illustrating configurations of the first and second semiconductor layers, according to an exemplary embodiment of the inventive concept.

FIG. 16 is a cross-sectional view taken along line VII-VII' of FIG. 14, illustrating configurations of the first and second semiconductor layers, according to an exemplary embodiment of the inventive concept. For example, FIG. 16 may be a cross-sectional view illustrating the second semiconductor layer L2 overlapping the via areas VA11 and VA21 provided in the first semiconductor layer L1. A repeated explanation of the same elements in FIG. 15 may not be given in FIG. 16.

Referring to FIG. 16, a plurality of through-hole vias THV1 passing through the first vertical structure VS1, the first upper substrate U_SUB_1, and a part of the second semiconductor layer L2 may be formed in the first via area VA11 Each of the through-hole vias THV1 may include an insulating film pattern IP4 and a conductive pattern MP4. A plurality of through-hole vias THV2 passing through the second vertical structure VS2, the second upper substrate U_SUB_2, and a part of the second semiconductor layer L2 may be formed in the second via area VA21. Each of the through-hole vias THV2 may include an insulating film pattern IP3 and a conductive pattern MP3.

As shown in FIG. 16, each of the through-hole vias THV2 may electrically connect the second page buffer circuit 413 and the second upper contact UMC2 and each of the through-hole vias THV2 may electrically connect the second page buffer circuit 413 and the first upper contact UMC1. The first upper contact UMC1 may be connected to the first bit-line BL_1 and the second upper contact UMC2 may be connected to the second bit-line BL_2. In other words, the first bit-lines BL_1 may be electrically connected to the second page buffer circuit 413 formed on the second semiconductor layer L2 through the plurality of through-hole vias THV1 formed in the first via area VA11 and the second bit-lines BL_2 may be electrically connected to the second page buffer circuit 413 formed on the second semiconductor layer L2 through the plurality of through-hole vias THV2 formed in the second via area VA21. In exemplary embodiments of the inventive concept, conductive patterns such as contacts may not be formed in an edge region EG_V1 of the first via area VA11 and in an edge region EG_V2 of the second via area VA21.

In exemplary embodiments of the inventive concept, in FIGS. 14 through 16, the first upper substrate U_SUB_1 and the second upper substrate U_SUB_2 may be connected to each other to form an upper substrate, and the first vertical structure VS1 and the second vertical structure VS2 may be connected to each other to form a vertical structure.

Figure 17:
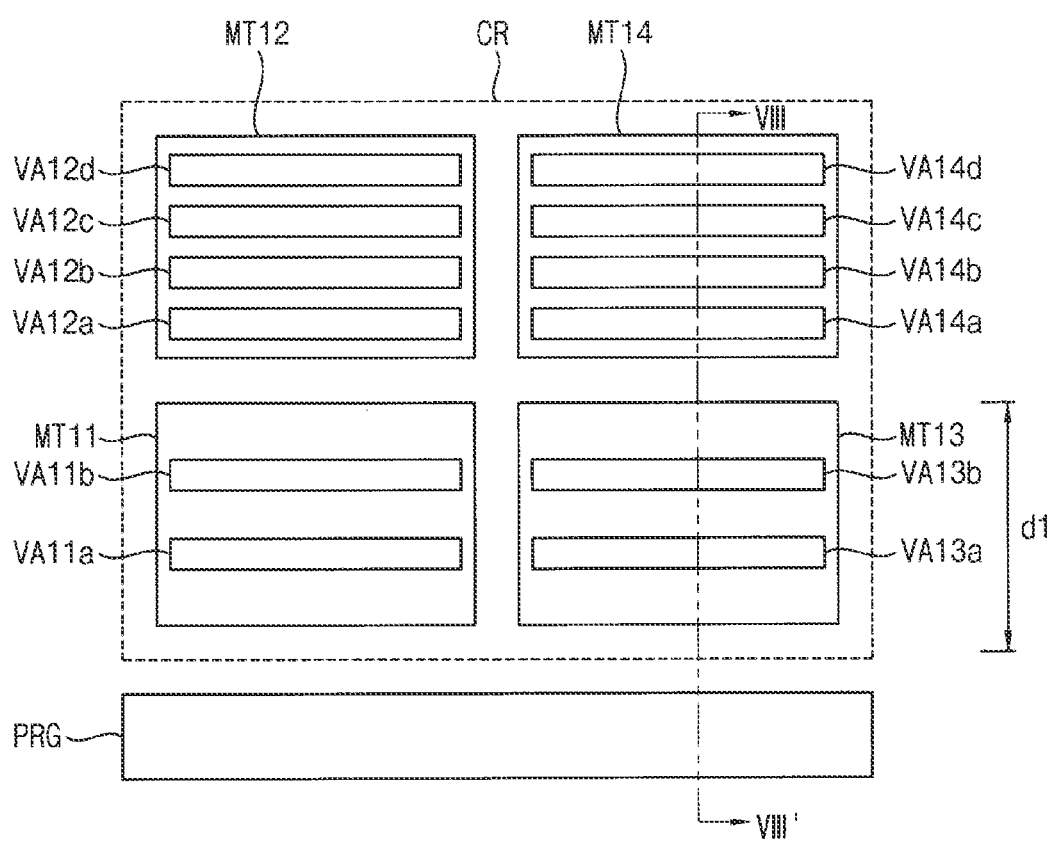
FIG. 17 illustrates an example in which the plurality of mats in FIG. 13 includes a different number of via areas, according to an exemplary embodiment of the inventive concept.
Figure 17:
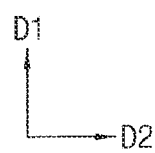

FIG. 17 illustrates an example in which the plurality of mats in FIG. 13 includes a different number of via areas, according to an exemplary embodiment of the inventive concept.

Referring to FIG. 17, the cell region CR, adjacent to the pad region PRG in the first direction, includes the plurality of mats MT11, MT12, MT13, and MT14. A first mat MT11 and a second mat MT12 may include a different number of via areas according to a distance from the pad region PRG in the first direction. A third mat MT13 and a fourth mat MT14 may include a different number of via areas according to a distance from the pad region PRG in the first direction.

A first distance from the pad region PRG to the first mat MT11 in the first direction is smaller than a reference d1 and the first mat MT11 includes a first number of via areas VA11a and VA11b. A second distance from the pad region PRG to the second mat MT12 in the first direction is greater than or equal to the reference distance d1 and the second mat MT12 includes a second number of via areas VA12a, VA12b, VA12c, and VA12d.

The first distance from the pad region PRG to the third mat MT13 in the first direction is smaller than the reference distance d1 and the third mat MT13 includes a first number of via areas VA13a and VA13b. The second distance from the pad region PRG to the fourth mat MT14 in the first direction is greater than or equal to the reference distance d1 and the fourth mat MT14 includes a second number of via areas VA14a, VA14b, VA14c, and VA14d.

Here, the first number may be smaller than the second number. A number of via areas included in each of the first through fourth mats MT11, MT12, MT13, and MT14 may be determined based on power requirement and signal routings of each of the first through fourth mats MT11, MT12, MT13, and MT14, or may be determined based on a voltage drop of an upper power line due to resistance with respect to the pad region PRG.

Figure 18:
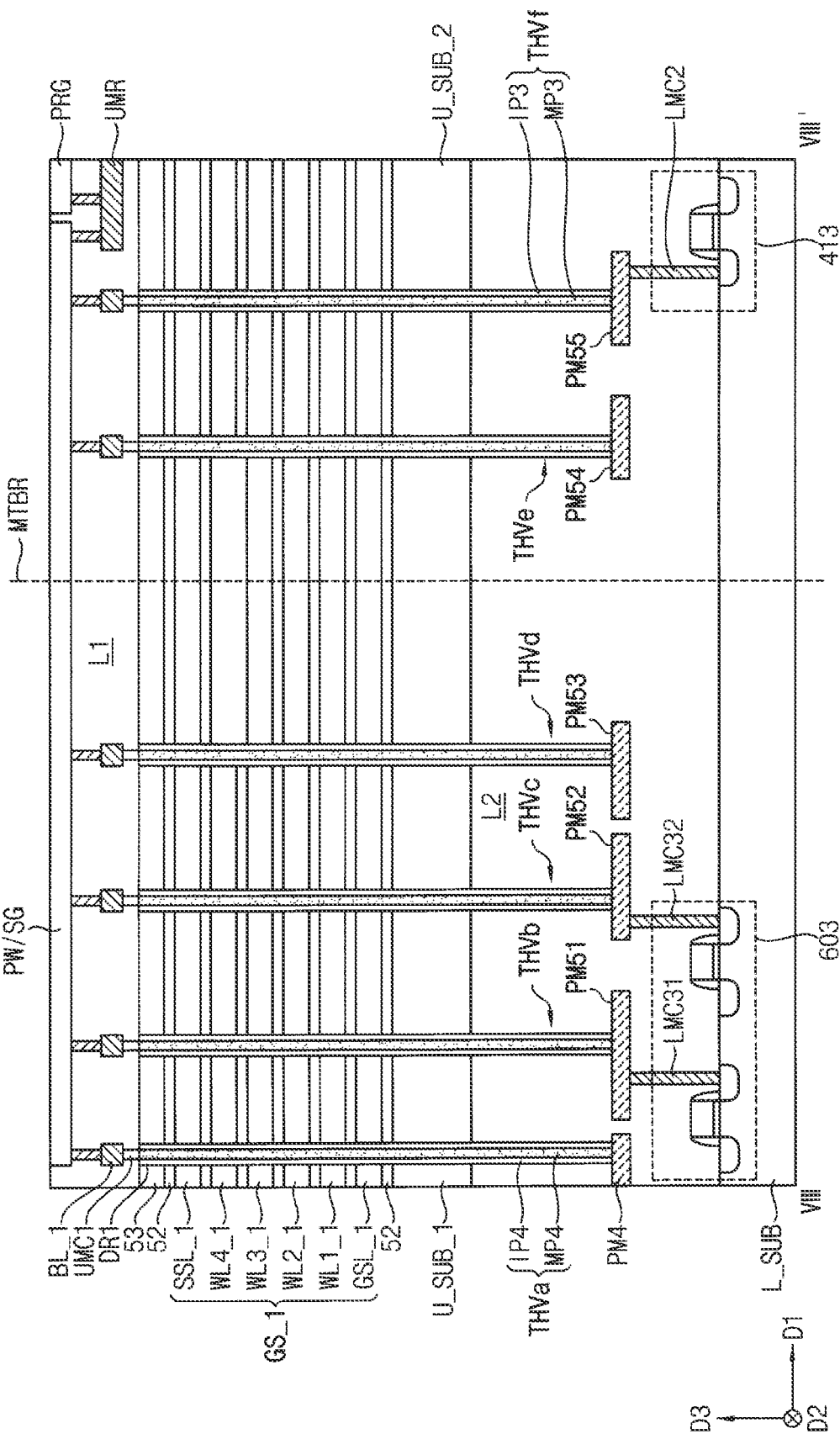
FIG. 18 is a cross-sectional view taken along line VIII-VIII' of FIG. 17 according to an exemplary embodiment of the inventive concept.

FIG. 18 is a cross-sectional view taken along line VIII-VIII' of FIG. 17 according to an exemplary embodiment of the inventive concept. FIG. 18 illustrates configurations of the first and second semiconductor layers.

Referring to FIG. 18, a metal region UMR is provided in the first semiconductor layer L1, and the pad region PRG and power/signal delivery region PW/SG are provided above the metal region UMR. In addition, a different number of through-hole vias THVa~THVf are provided in the first semiconductor layer L1 and the second semiconductor layer L2 according to a distance from the pad region PRG in the first direction with respect to a mat boundary MTBR.

The through-hole via THVa is connected to a lower conductive line PM4. The through-hole via THVb is connected to the second address decoder 603 through a lower conductive line PM51 and a lower contact LMC31, and the through-hole via THVc is connected to the second address decoder 603 through a lower conductive line PM52 and a lower contact LMC32. The through-hole via THVd is connected to a lower conductive line PM53. The through-hole via THVe is connected to a lower conductive line PM54 and the through-hole via THVe is connected to the second page buffer circuit 413 through a lower conductive line PM55 and a lower contact LMC2. The lower conductive line PM55 may include the insulating film pattern IP3 and the conductive pattern MP3.

Figure 19:
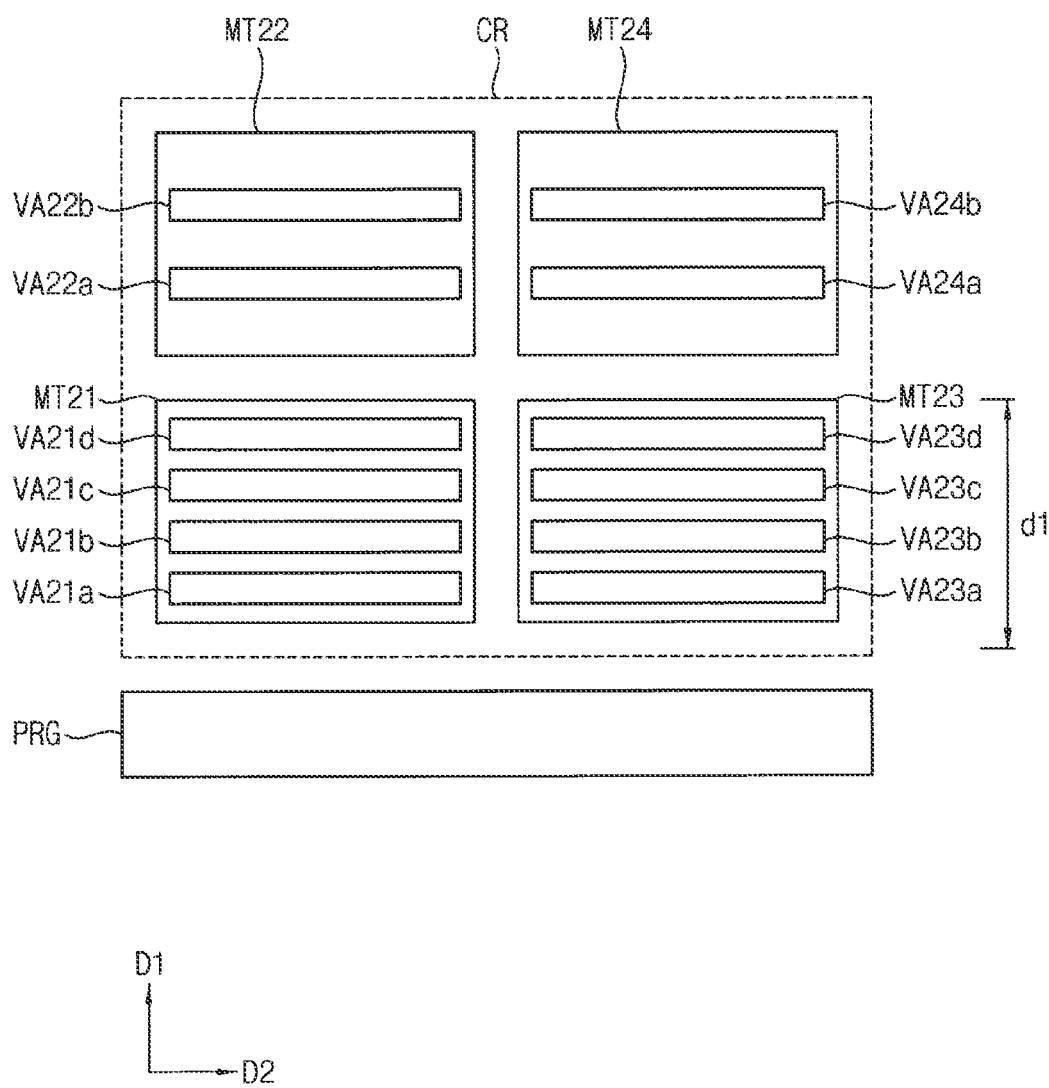
FIG. 19 illustrates an example in which the plurality of mats in FIG. 13 includes a different number of via areas, according to an exemplary embodiment of the inventive concept.

FIG. 19 illustrates an example in which the plurality of mats in FIG. 13 includes a different number of via areas, according to an exemplary embodiment of the inventive concept.

Referring to FIG. 19, the cell region CR, adjacent to the pad region PRG in the first direction, includes a plurality of mats MT21, MT22, MT23, and MT24. A first mat MT21 and a second mat MT22 may include a different number of via areas according to a distance from the pad region PRG in the first direction. A third mat MT23 and a fourth mat MT24 may include a different number of via areas according to a distance from the pad region PRG in the first direction.

A first distance from the pad region PRG to the first mat MT21 in the first direction is smaller than the reference distance d1 and the first mat MT21 includes a first number of via areas VA21a, VA21b, VA21c, and VA21d. A second distance from the pad region PRG to the second mat MT22 in the first direction is greater than or equal to the reference distance d1 and the second mat MT22 includes a second number of via areas VA22a and VA22b.

The first distance from the pad region PRG to the third mat MT23 in the first direction is smaller than the reference d1 and the third mat MT23 includes a first number of via areas VA23a, VA23b, VA23c, and VA24d. The second distance from the pad region PRG to the fourth mat MT24 in the first direction is greater than or equal to the reference d1 and the fourth mat MT24 includes a second number of via areas VA24a and VA24b.

Here, the first number may be greater than the second number. The control circuit 500 in FIG. 3 may store hot data in at least one of the first mat MT21 and the third mat MT23, and may store cold data in at least one of the second mat MT22 and the fourth mat MT24 based on access frequency of the data. The hot data is accessed with a first frequency greater than a reference frequency during a reference time interval, and the cold data is accessed with a second frequency less than or equal to the reference frequency during the reference time interval.

Figure 20:
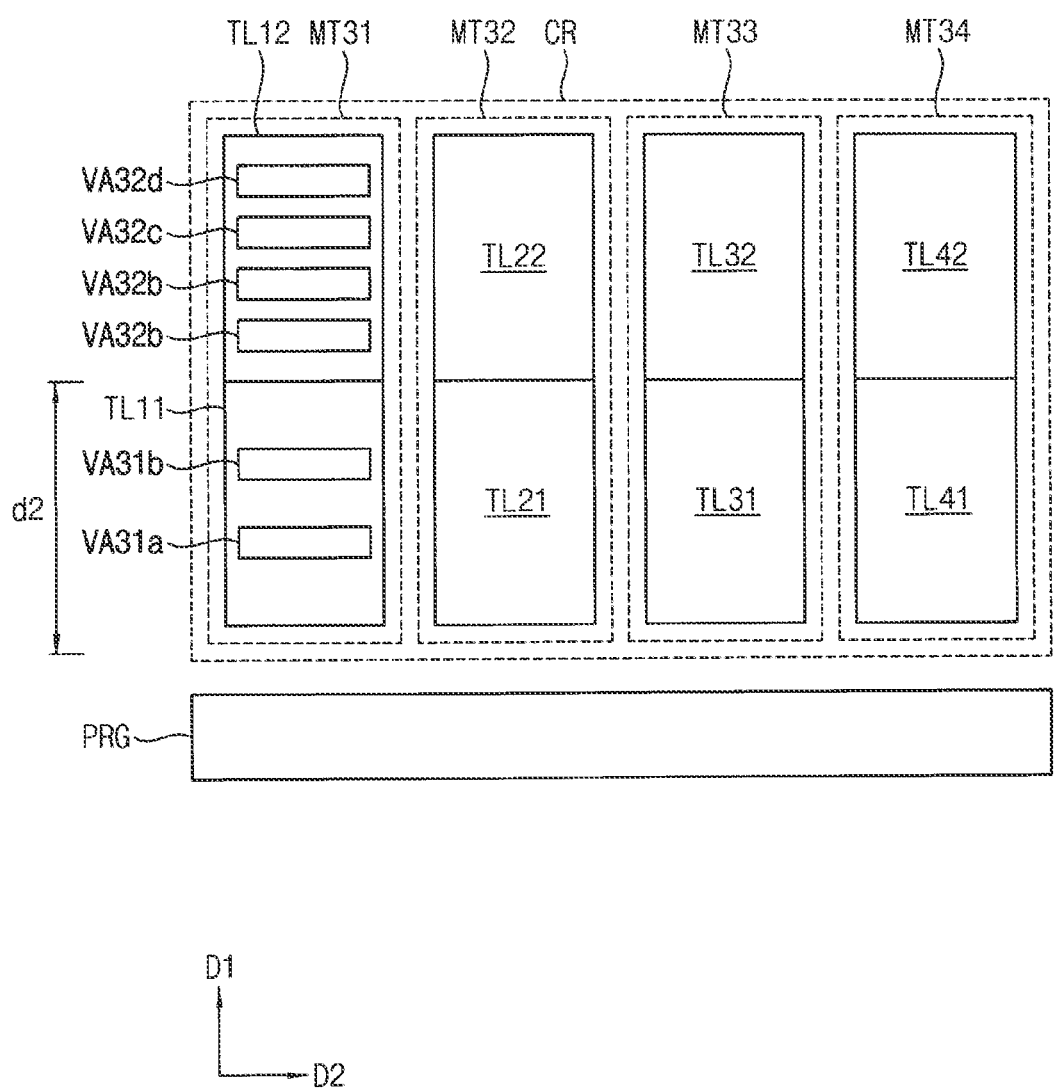
FIG. 20 illustrates an example in which the plurality of mats in FIG. 13 includes a different number of via areas, according to an exemplary embodiment of the inventive concept.

FIG. 20 illustrates an example in which the plurality of mats in FIG. 13 includes a different number of via areas, according to an exemplary embodiment of the inventive concept.

Referring to FIG. 20, the cell region CR, adjacent to the pad region PRG in the first direction, includes a plurality of mats MT31, MT32, MT33, and MT34. A first mat MT31 includes a first tile TL11 and a second tile TL12 which are identified according to a distance from the pad region PRG in the first direction. A second mat MT32 includes a first tile TL21 and a second tile TL22 which are identified according to a distance from the pad region PRG in the first direction. A third mat MT33 includes a first tile TL31 and a second tile TL32 which are identified according to a distance from the pad region PRG in the first direction. A fourth mat MT34 includes a first tile TL41 and a second tile TL42 which are identified according to a distance from the pad region PRG in the first direction. Each of the first tiles TL11, TL21, TL31, and TL41 and each of the second tiles TL12, TL22, TL32, and TL42 may include a different number of via areas according to the distance from the pad region PRG in the first direction.

For example, a first distance from the pad region PRG to the first tile TL11 in the first direction is smaller than a reference distance d2 and the first tile TL11 includes a first number of via areas VA31a and VA31b. A second distance from the pad region PRG to the second tile TL12 in the first direction is greater than or equal to the reference distance d2 and the second tile TL12 includes a second number of via areas VA32a, VA32b, VA32c, and VA32d.

Here, the first number may be smaller than the second number. A number of via areas included in each of the first tile TL11 and the second tile TL12 may be determined based on power requirement and signal routings of each of the first tile TL11 and the second tile TL12, or may be determined based on a voltage drop of an upper power line due to resistance with respect to the pad region PRG.

Figure 21:
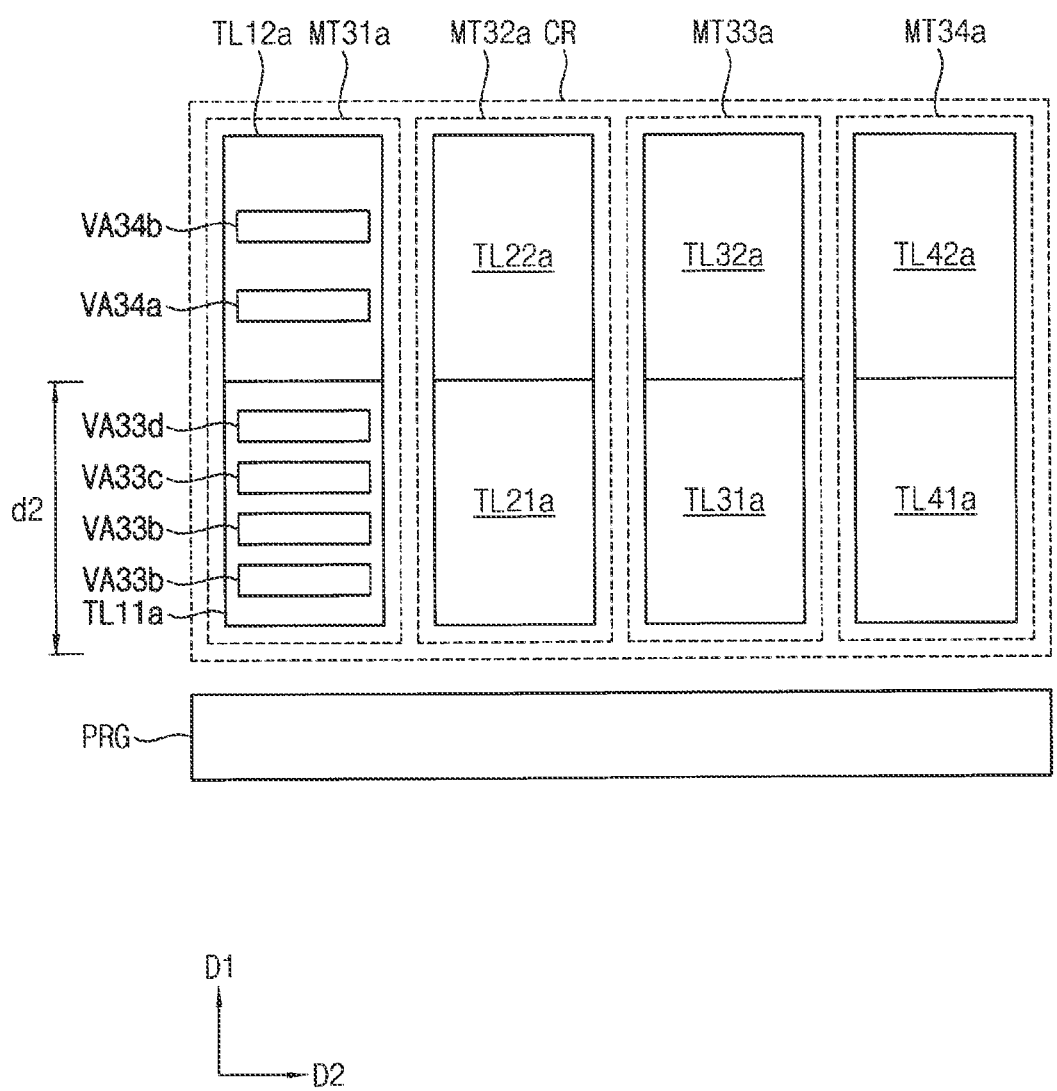
FIG. 21 illustrates an example in which the plurality of mats in FIG. 13 includes a different number of via areas, according to an exemplary embodiment of the inventive concept.

FIG. 21 illustrates an example in which the plurality of mats in FIG. 13 includes a different number of via areas, according to an exemplary embodiment of the inventive concept.

Referring to FIG. 21, the cell region CR, adjacent to the pad region PRG in the first direction, includes a plurality of mats MT31a, MT32a, MT33a, and MT34a. A first mat MT31a includes a first tile TL11a and a second tile TL12a which are identified according to a distance from the pad region PRG in the first direction. A second mat MT32a includes a first tile TL21a and a second tile TL22a which are identified according to a distance from the pad region PRG in the first direction. A third mat MT33a includes a first tile TL31a and a second tile TL32a which are identified according to a distance from the pad region PRG in the first direction. A fourth mat MT34a includes a first tile TL41a and a second tile TL42a which are identified according to a distance from the pad region PRG in the first direction. Each of the first tiles TL11a, TL21a, TL31a, and TL41a, and each of the second tiles TL12a, TL22a, TL32a, and TL42a may include a different number of via areas according to the distance from the pad region PRG in the first direction.

For example, a first distance from the pad region PRG to the first tile TL11a in the first direction is smaller than the reference distance d2, and the first tile TL11a includes a first number of via areas VA33a, VA33b, VA33c, and VA33d. A second distance from the pad region PRG to the second tile TL12a in the first direction is greater than or equal to the reference distance d2 and the second tile TL12a includes a second number of via areas VA34a and VA34b.

Here, the first number may be greater than the second number. The control circuit 500 in FIG. 3 may store hot data in the first tile TL11a and may store cold data in the second tile TL12a.

Figure 22:
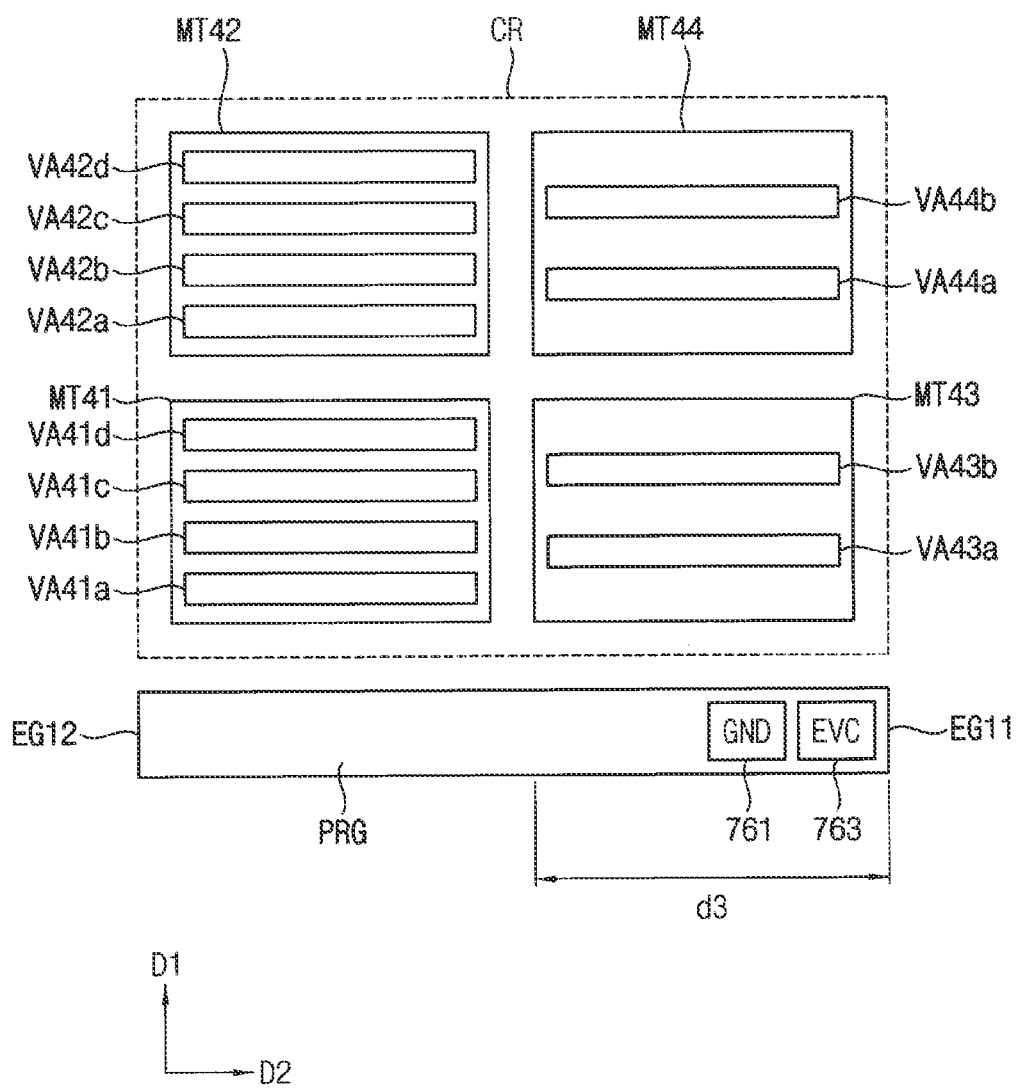
FIG. 22 illustrates an example in which the plurality of mats in FIG. 13 includes a different number of via areas, according to an exemplary embodiment of the inventive concept.

FIG. 22 illustrates an example in which the plurality of mats in FIG. 13 includes a different number of via areas, according to an exemplary embodiment of the inventive concept.

Referring to FIG. 22, the cell region CR, adjacent to the pad region PRG in the first direction, includes a plurality of mats MT41, MT42, MT43, and MT44. The pad region PRG includes the power pads 761 and 763 disposed adjacent to the first edge portion EG11. The ground voltage GND may be provided to the mats MT41, MT42, MT43, and MT44 through the power pad 761 and the power supply voltage EVC may be provided to the mats MT41, MT42, MT43, and MT44 through the power pad 763.

A first mat MT41 and a third mat MT43 may include a different number of via areas according to a distance from the power pad 763 in the second direction. A second mat MT42 and a fourth mat MT44 may include a different number of via areas according to a distance from the power pad 763 in the second direction.

A first distance from the power pad 763 or the first edge portion EG11 to the third mat MT43 in the second direction is smaller than a reference d3, and the third mat MT43 includes a first number of via areas VA43a and VA43b. A second distance from the power pad 763 or the first edge portion EG11 to the first mat MT41 in the second direction is greater than or equal to the reference distance d3 and the first mat MT41 includes a second number of via areas VA41a, VA41b, VA41c, and VA41d.

The first distance from the power pad 763 or the first edge portion EG11 to the fourth mat MT44 in the second direction is smaller than the reference distance d3 and the fourth mat MT44 includes a first number of via areas VA44a and VA44b. The second distance from the power pad 763 or the first edge portion EG11 to the second mat MT42 in the second direction is greater than or equal to the reference distance d3 and the second mat MT42 includes a second number of via areas VA42a, VA42b, VA42c, and VA42d. Here, the first number may be smaller than the second number.

Figure 23:
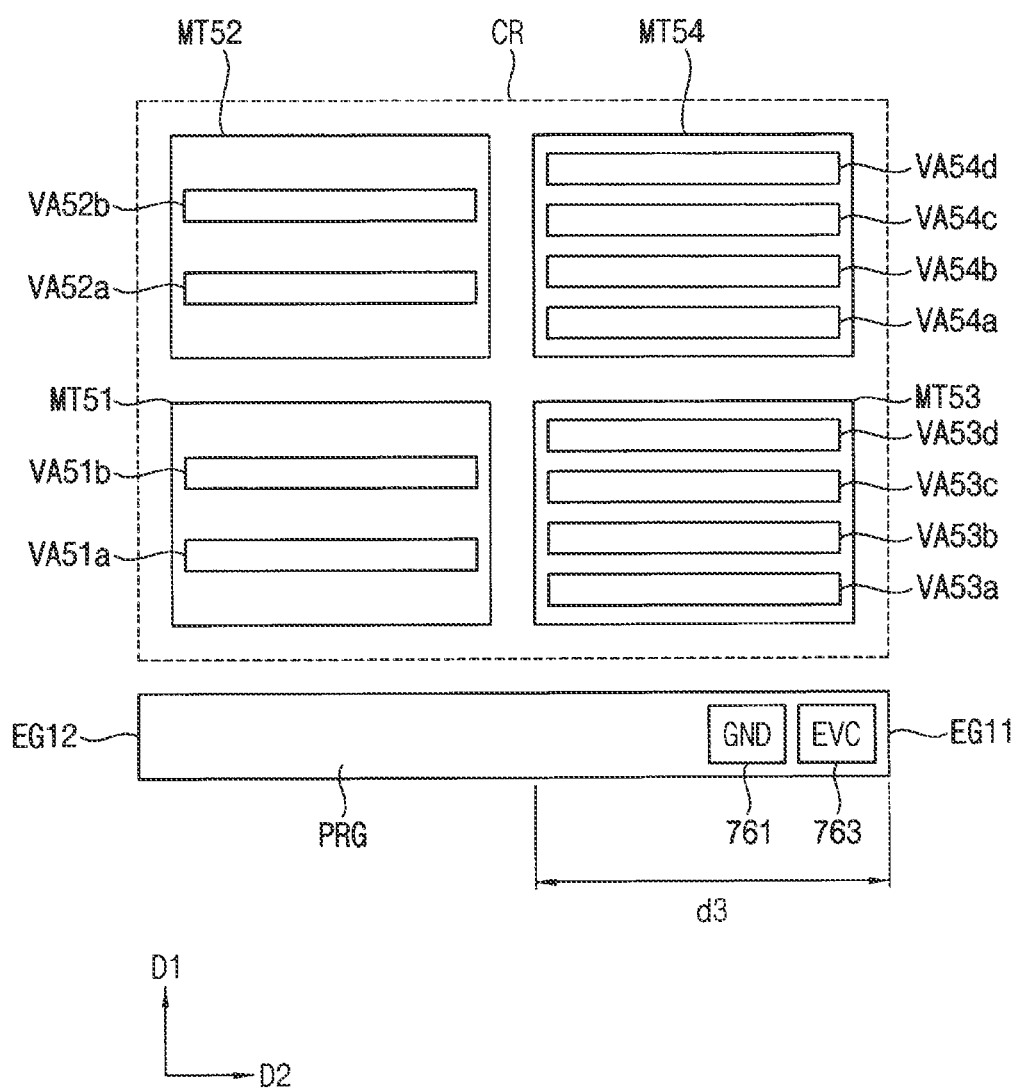
FIG. 23 illustrates an example in which the plurality of mats in FIG. 13 includes a different number of via areas, according to an exemplary embodiment of the inventive concept.

FIG. 23 illustrates an example in which the plurality of mats in FIG. 13 includes a different number of via areas, according to an exemplary embodiment of the inventive concept.

Referring to FIG. 23, the cell region CR, adjacent to the pad region PRG in the first direction, includes a plurality of mats MT51, MT52, MT53, and MT54. The pad region PRG includes the power pads 761 and 763 disposed adjacent to the first edge portion EG11. The ground voltage GND may be provided to the mats MT51, MT52, MT53 and MT54 through the power pad 761, and the power supply voltage EVC may be provided to the mats MT51, MT52, MT53, and MT54 through the power pad 763.

A first mat MT51 and a third mat MT53 may include a different number of via areas according to a distance from the power pad 763 in the second direction. A second mat MT52 and a fourth mat MT54 may include a different number of via areas according to a distance from the power pad 763 in the second direction.

A first distance from the power pad 763 or the first edge portion EG11 to the third mat MT53 in the second direction is smaller than the reference distance d3, and the third mat MT53 includes a first number of via areas VA53a, VA53b, VA53c, and VA53d. A second distance from the power pad 763 or the first edge portion EG11 to the first mat MT51 in the second direction is greater than or equal to the reference distance d3 and the first mat MT51 includes a second number of via areas VA51a and VA51b.

The first distance from the power pad 763 or the first edge portion EG11 to the fourth mat MT54 in the second direction is smaller than the reference d3 and the fourth mat MT54 includes a first number of via areas VA54a, VA54b, VA54c, and VA54d. The second distance from the power pad 763 or the first edge portion EG11 to the second mat MT52 in the second direction is greater than or equal to the reference distance d3 and the second mat MT52 includes a second number of via areas VA52a and VA52b. Here, the first number may be greater than the second number.

The control circuit 500 in FIG. 3 may store hot data in the mat MT53 or the mat MT54, and may store cold data in the mat MT51 or the mat MT52.

Figure 24:
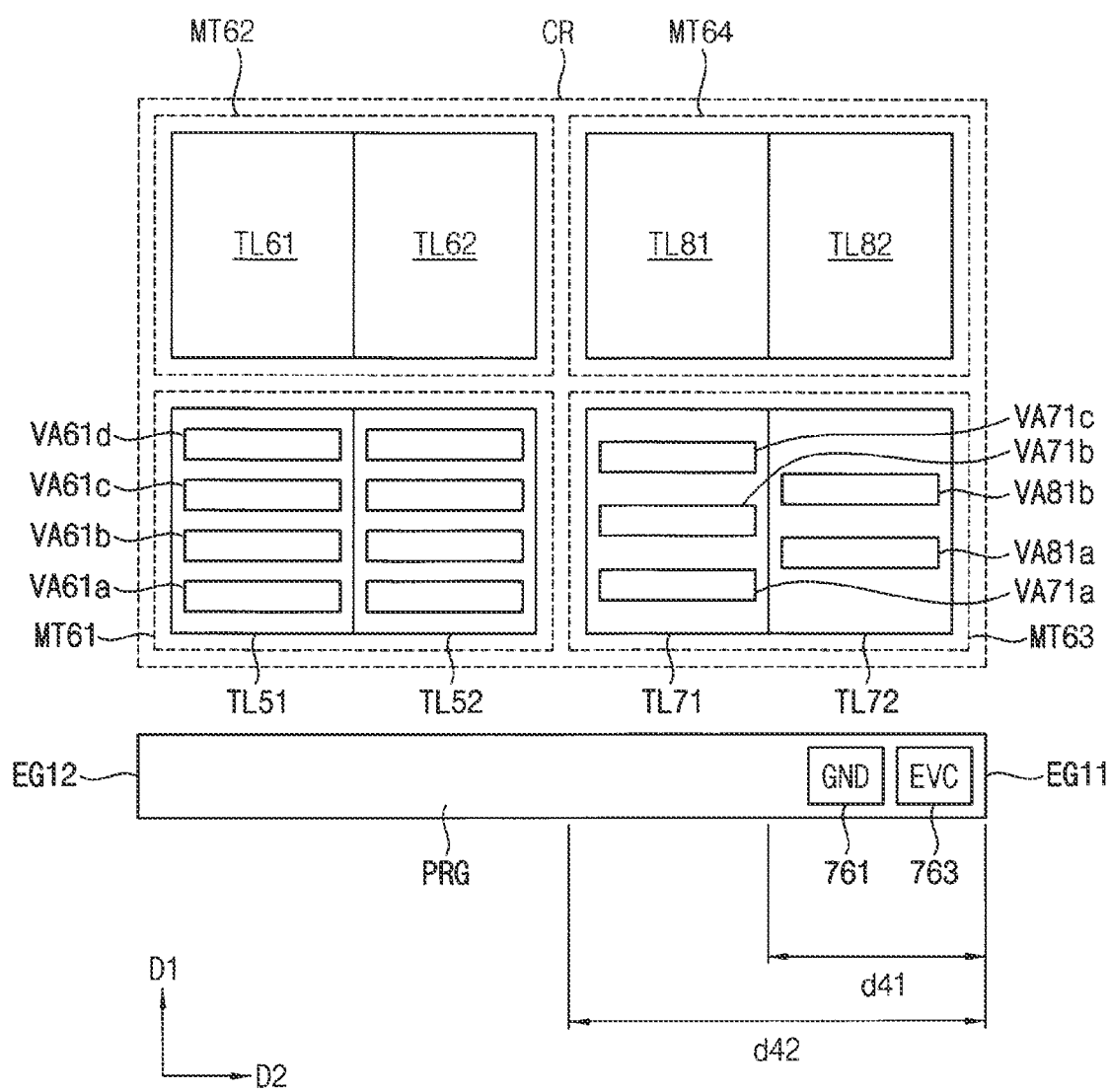
FIG. 24 illustrates an example in which the plurality of mats in FIG. 13 includes a different number of via areas, according to an exemplary embodiment of the inventive concept.

FIG. 24 illustrates an example in which the plurality of mats in FIG. 13 includes a different number of via areas, according to an exemplary embodiment of the inventive concept.

Referring to FIG. 24, the cell region CR, adjacent to the pad region PRG in the first direction, includes a plurality of mats MT61, MT62, MT63, and MT64. The pad region PRG includes the power pads 761 and 763 disposed adjacent to the first edge portion EG11. The ground voltage GND may be provided to the mats MT61, MT62, MT63, and MT64 through the power pad 761, and the power supply voltage EVC may be provided to the mats MT61, MT62, MT63, and MT64 through the power pad 763.

The mat MT61 includes a first tile TL51 and a second tile TL52, the mat MT62 includes a first tile TL61 and a second tile TL62, the mat MT63 includes a first tile TL71 and a second tile TL72, and the mat MT64 includes a first tile TL81 and a second tile TL82. The mat MT63 includes the first tile TL71 and the second tile TL72 which are identified according to a distance from the power pad 763 or the first edge portion EG11 in the second direction, and the mat MT64 includes the first tile TL81 and the second tile TL82 which are identified according to a distance from the power pad 763 or the first edge portion EG11 in the second direction.

A first distance from the power pad 763 or the first edge portion EG11 to the second tile TL72 is smaller than a first reference distance d41, and the second tile TL72 includes a first number of via areas VA81a and VA81b. The second tile TL82 may also include the first number of via areas. A second distance from the power pad 763 or the first edge portion EG11 to the first tile TL71 is greater than or equal to the first reference distance d41 and is smaller than a second reference distance d42, and the first tile TL71 includes a second number of via areas VA71a, VA71b, and VA71c. The first tile TL81 may also include the second number of via areas.

A third distance from the power pad 763 or the first edge portion EG11 to the first tile TL51 is greater than or equal to the second reference d42, and the first tile TL51 includes a third number of via areas VA61a, VA61b, VA61c, and VA61d. A fourth distance from the power pad 763 or the first edge portion EG11 to the second tile TL52 is greater than or equal to the second reference d42, and the second tile TL52 also includes the third number of via areas. The first and second tiles TL61 and TL62 may each include the third number of via areas as well. Here, the second number is greater than the first number and third number is greater than the second number.

Figure 25:
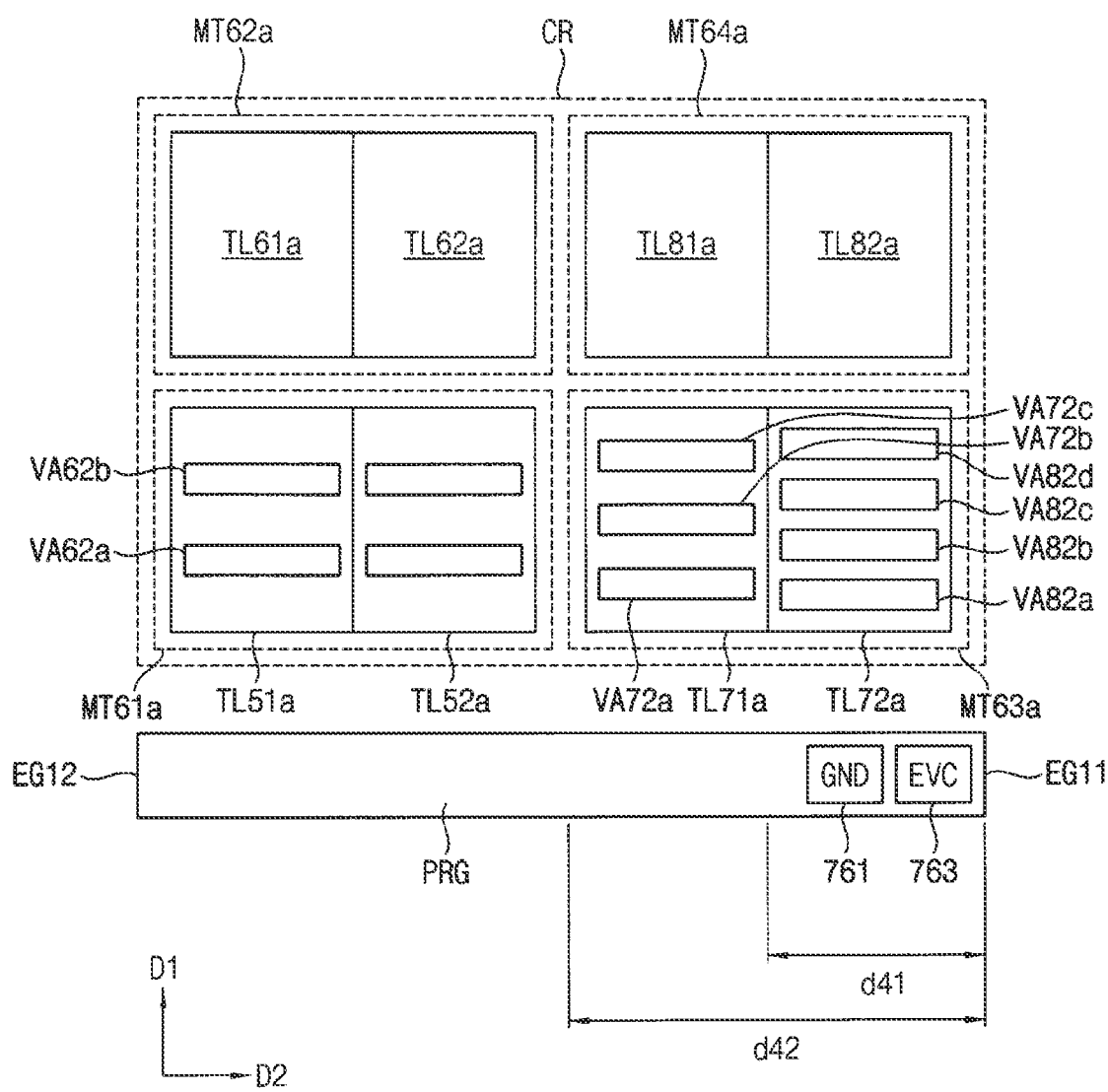
FIG. 25 illustrates an example in which the plurality of mats in FIG. 13 includes a different number of via areas, according to an exemplary embodiment of the inventive concept.

FIG. 25 illustrates an example in which the plurality of mats in FIG. 13 includes a different number of via areas, according to an exemplary embodiment of the inventive concept.

Referring to FIG. 25, the cell region CR, adjacent to the pad region PRG in the first direction, includes a plurality of mats MT61a, MT62a, MT63a, and MT64a. The pad region PRG includes the power pads 761 and 763 disposed adjacent to the first edge portion EG11. The ground voltage GND may be provided to the mats MT6a1, MT62a, MT63a, and MT64a through the power pad 761, and the power supply voltage EVC may be provided to the mats MT61a, MT62a, MT63a, and MT64a through the power pad 763.

The mat MT61a includes a first tile TL51a and a second tile TL52a, the mat MT62a includes a first tile TL61a and a second tile TL62a, the mat MT63a includes a first tile TL71a and a second tile TL72a, and the mat MT64a includes a first tile TL81a and a second tile TL82a. The mat MT63a includes the first tile TL71a and the second tile TL72a which are identified according to a distance from the power pad 763 or the first edge portion EG11 in the second direction, and the mat MT64a includes the first tile TL81a and the second tile TL82a which are identified according to a distance from the power pad 763 or the first edge portion EG11 in the second direction.

A first distance from the power pad 763 or the first edge portion EG11 to the second tile TL72a is smaller than the first reference d41, and the second tile TL72a includes a first number of via areas VA82a, VA82b, VA82c, and VA82d. The second tile TL82a may also include the first number of via areas. A second distance from the power pad 763 or the first edge portion EG11 to the first tile TL71a is greater than or equal to the first reference distance d41 and is smaller than the second reference distance d42, and the first tile TL71a includes a second number of via areas VA72a, VA72b, and VA72c. The first tile TL81a may also include the second number of via areas.

A third distance from the power pad 763 or the first edge portion EG11 to the first tile TL51a is greater than or equal to the second reference distance d42, and the first tile TL51a includes a third number of via areas VA62a and VA62b. A fourth distance from the power pad 763 or the first edge portion EG11 to the second tile TL52a is greater than or equal to the second reference distance d42, and the second tile TL52a also includes the third number of via areas. Additionally, the first and second tiles TL61a and TL62a may each include the third number of via areas. Here, the first number is greater than the second number and second number is greater than the third number.

The control circuit 500 in FIG. 3 may store hot data in the tiles TL72a and TL82a, and may store cold data in the mats MT61a and MT62a.

Figure 26:
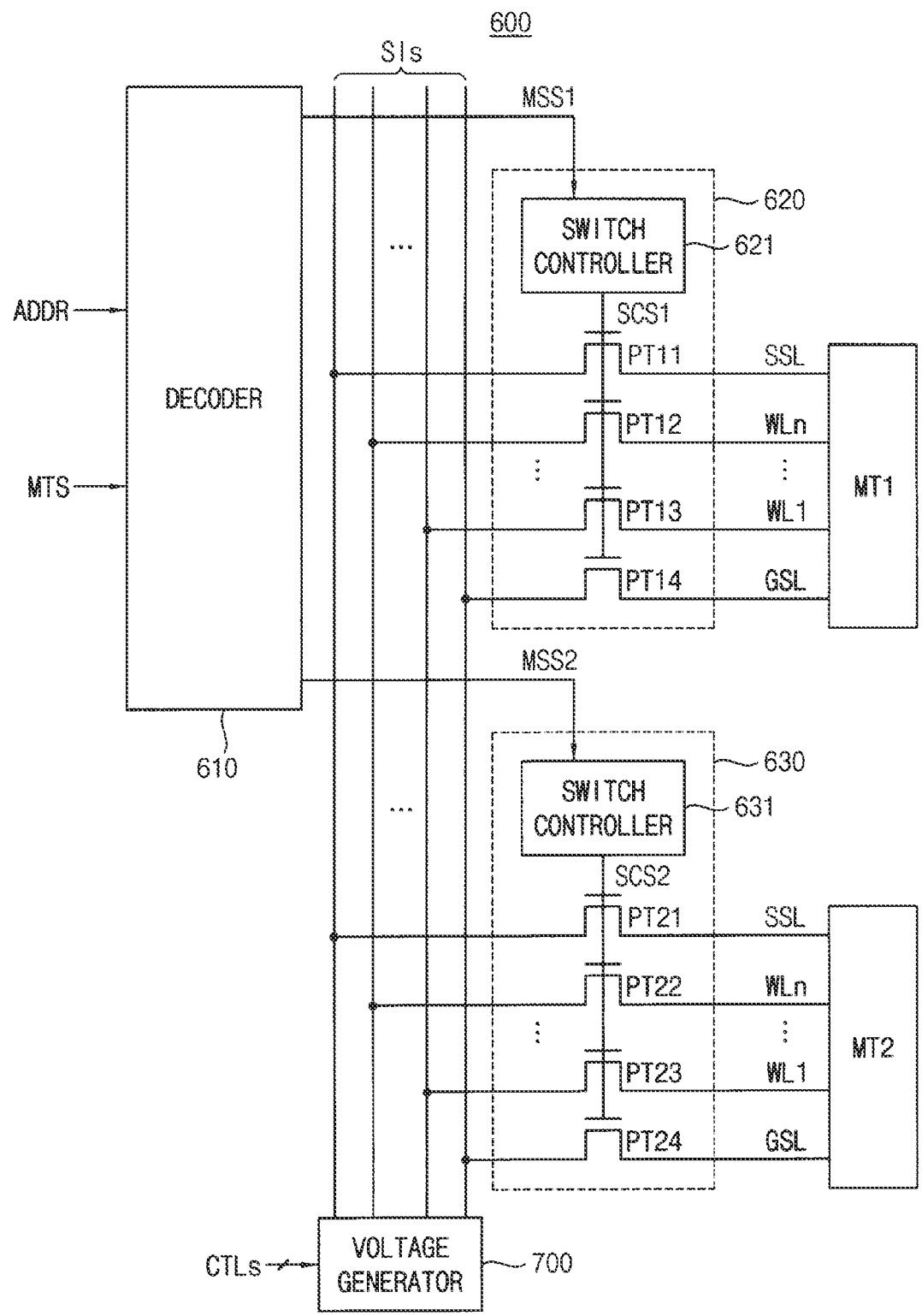
FIG. 26 is a block diagram illustrating an address decoder in the nonvolatile memory device of FIG. 3 according to an exemplary embodiment of the inventive concept.

FIG. 26 is a block diagram illustrating an address decoder in the nonvolatile memory device of FIG. 3 according to an exemplary embodiment of the inventive concept.

In FIG. 26, the first mat MT1 and the second mat MT2 of the memory cell array 100 and the voltage generator 700 are also illustrated.

Referring to FIG. 26, the address decoder 600 includes a decoder 610, a first switch circuit 620, and a second switch circuit 630. The first switch circuit 620 may be included in the first address decoder 601 in FIG. 11, and the second switch circuit 630 may be included in the second address decoder 603 in FIG. 11.

The decoder 610 receives the address ADDR and the meta signal MTS, and generates a first mat selection signal MSS1 to select the first mat MT1 and a second mat selection signal MSS2 to select the second mat MT2 based on at least one mat designated by the address ADDR and the meta signal MTS. The decoder 610 provides the first mat selection signal MSS1 and the second mat selection signal MSS2 to the first switch circuit 620 and the second switch circuit 630, respectively.

The first switch circuit 620 and the second switch circuit 630 may be coupled to a plurality of selection lines Sls coupled to the voltage generator 700. The first switch circuit 620 is coupled to the first mat MT1 through at least one string selection line SSL, a plurality of word-lines WL1~WLn, and at least one ground selection line GSL. The second switch circuit 630 is coupled to the second mat MT2 through at least one string selection line SSL, a plurality of word-lines WL1~WLn, and at least one ground selection line GSL.

The first switch circuit 620 includes a switch controller 621 and a plurality of pass transistors PT11~PT14 coupled to the string selection line SSL, the word-lines WL1~WLn, and the ground selection line GSL of the first mat MT1. The switch controller 621 may control turn-on and turn-off of the pass transistors PT11~PT14 and turn-on timing of the pass transistors PT11~PT14 via a signal SCSI in response to the first mat selection signal MSS1.

The second switch circuit 630 includes a switch controller 631 and a plurality of pass transistors PT21~PT24 coupled to the string selection line SSL, the word-lines WL1~WLn, and the ground selection line GSL of the second mat MAT2. The switch controller 631 may control turn-on and turn-off of the pass transistors PT21~PT24 via a signal SCS2 in response to the second mat selection signal MSS2.

Figure 27:
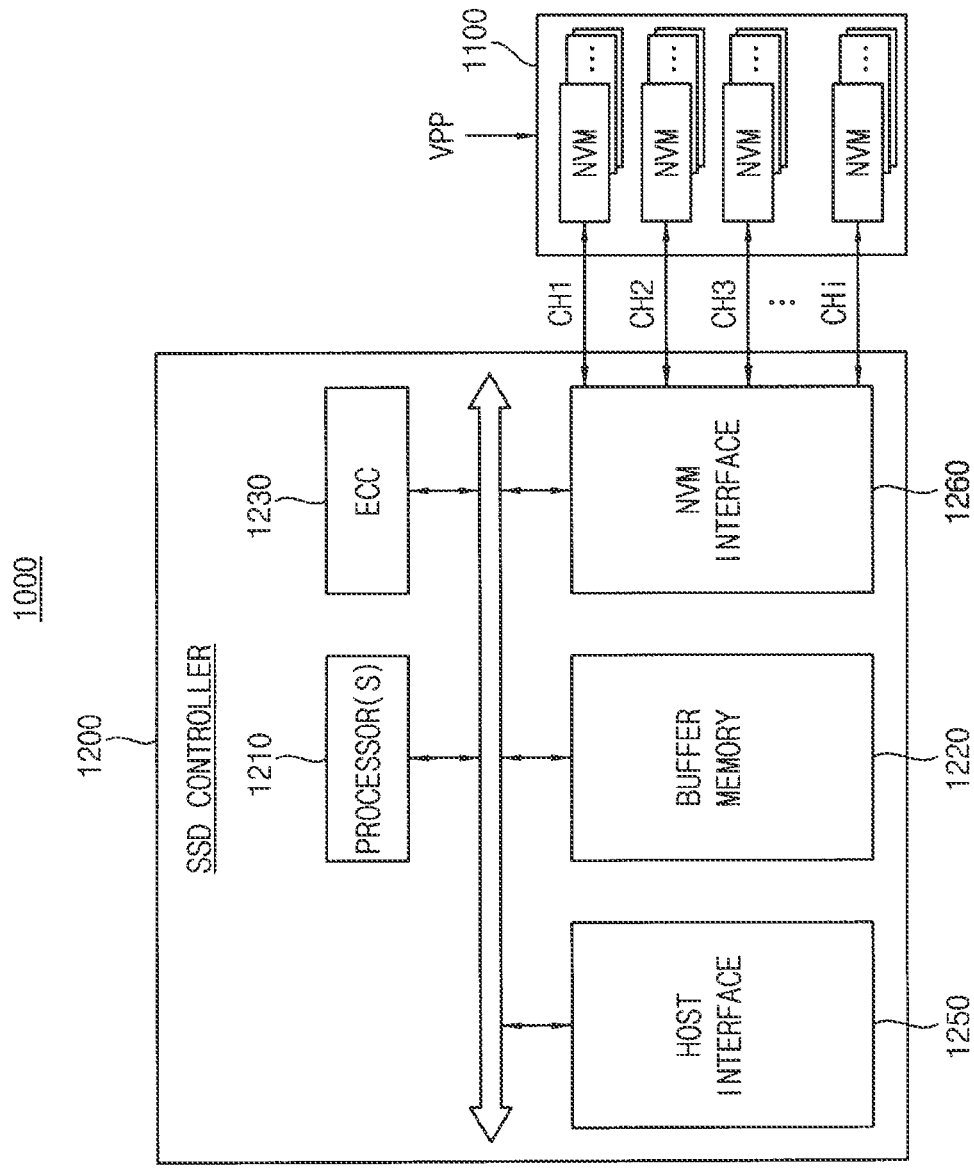
FIG. 27 is a block diagram illustrating a solid state disc or solid state drive (SSD) including nonvolatile memory devices according to an exemplary embodiment of the inventive concept.

FIG. 27 is a block diagram illustrating a solid state disc or solid state drive (SSD) including nonvolatile memory devices according to an exemplary embodiment of the inventive concept.

Referring to FIG. 27, a SSD 1000 includes multiple nonvolatile memory devices 1100 and an SSD controller 1200.

The SSD controller 1200 may be connected to the nonvolatile memory devices 1100 through multiple channels CH1, CH2, CH3, ... , CHi. The SSD controller 1200 may include one or more processors 1210, a buffer memory 1220, an error correction code (ECC) circuit 1230, a host interface 1250, and a nonvolatile memory interface 1260.

The buffer memory 1220 may store data used to drive the SSD controller 1200. The buffer memory 1220 may include multiple memory lines each storing data or a command. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may be the nonvolatile memory device according to exemplary embodiments of the inventive concept described above, and may be optionally supplied with an external high voltage VPP.

A nonvolatile memory device or a storage device according to exemplary embodiments of the inventive concept may be packaged using various package types or package configurations.

The inventive concept may be applied to various electronic devices including a nonvolatile memory device.

Accordingly, a nonvolatile memory device having a cell-over-peri (COP) structure may include a plurality of mats/tiles including a plurality of via areas in which through-hole vias are provided, and the through-hole vias transfer signal/power to the plurality of mats/tiles. At least some of the mats/tile include a different number of via areas according to a distance from a pad region or a power pad. Therefore, the nonvolatile memory device may have enhanced performance without increasing chip size.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A nonvolatile memory device comprising:
a first semiconductor layer including an upper substrate in which a plurality of word-lines extending in a first direction and a plurality of bit-lines extending in a second direction perpendicular to the first direction are disposed and a memory cell array including a vertical structure on the upper substrate, wherein the vertical structure includes a plurality of memory blocks;
a second semiconductor layer under the first semiconductor layer in a third direction perpendicular to the first and second directions, wherein the second semiconductor layer includes a lower substrate that includes a plurality of address decoders and a plurality of page buffer circuits configured to control the memory cell array;
a control circuit configured to control the plurality of address decoders and the plurality of page buffer circuits in response to a command and an address from an external device; and
a pad region disposed adjacent to the first semiconductor layer in the first direction and extending in the second direction,
wherein the vertical structure includes a plurality of via areas in which one or more through-hole vias are provided and the plurality of via areas are spaced apart in the second direction,
wherein the memory cell array at least includes a first mat and a second mat corresponding to different bit-lines of the plurality of bit-lines,
wherein the first mat is disposed within a reference distance from the pad region in the first direction and the second mat is disposed out of the reference distance from the pad region in the first direction, and
wherein the first mat and the second mat include a different number of the via areas in the first direction.

2. The nonvolatile memory device of claim 1, wherein:
the first mat includes a first number of the via areas, the second mat includes a second number of the via areas, and
the first number is smaller than the second number.

3. The nonvolatile memory device of claim 1, wherein:
the first mat includes a first number of the via areas, the second mat includes a second number of the via areas, and
the first number is greater than the second number.

4. The nonvolatile memory device of claim 3, wherein:
the control circuit is configured to selectively store hot data and cold data in the first mat and the second mat based on an access frequency from the external device,
the control circuit is configured to store the hot data in the first mat and is configured to store the cold data in the second mat,
the hot data is accessed with a first frequency greater than a reference frequency during a reference time interval, and
the cold data is accessed with a second frequency less than or equal to the reference frequency during the reference time interval.

5. The nonvolatile memory device of claim 1, wherein the second semiconductor layer comprises first, second, third, and fourth regions that are divided along the first and second directions intersecting at a point overlapping the memory cell array in the third direction,
wherein the first and second regions are adjacent to each other in the first direction, and the second and third regions are adjacent to each other in the second direction,
wherein the plurality of page buffer circuits include first through fourth page buffer circuits located in the first through fourth regions, respectively.

6. The nonvolatile memory device of claim 1, wherein at least a first portion of the one or more through-hole vias connect at least some portion of the plurality of bit-lines to at least some portion of the plurality of page buffer circuits, and
wherein at least a second portion of the one or more through-hole vias connect at least some portion of the plurality of word-lines to at least some portion of the plurality of address decoders.

7. A nonvolatile memory device comprising:
a first semiconductor layer including an upper substrate in which a plurality of word-lines extending in a first direction and a plurality of bit-lines extending in a second direction perpendicular to the first direction are disposed and a memory cell array including a vertical structure on the upper substrate, wherein the vertical structure includes a plurality of memory blocks;
a second semiconductor layer under the first semiconductor layer in a third direction perpendicular to the first and second directions, wherein the second semiconductor layer includes a lower substrate that includes a plurality of address decoders and a plurality of page buffer circuits configured to control the memory cell array;
a control circuit configured to control the plurality of address decoders and the plurality of page buffer circuits in response to a command and an address from an external device; and
a pad region disposed adjacent to the first semiconductor layer in the first direction and extending in the second direction, wherein the vertical structure includes a plurality of via areas in which one or more through-hole vias are provided and the plurality of via areas are spaced apart in the second direction, wherein the memory cell array at least includes a first mat, a second mat, a third mat and a fourth mat corresponding to different bit-lines of the plurality of bit-lines, wherein the first mat is disposed within a first reference distance from the pad region in the first direction and the second mat is disposed out of the first reference distance from the pad region in the first direction, wherein the third mat is disposed within the first reference distance from the pad region in the first direction and the second mat is disposed out of the first reference distance from the pad region in the first direction, wherein each of the first mat and the second mat is out of a second reference distance from an edge of the pad region in the second direction, wherein each of the third mat and the fourth mat is within the second reference distance from the edge of the pad region in the second direction, and wherein:
each of the first tile and the third tile includes a first number of the via areas,
each of the second tile and the fourth tile includes a second number of the via areas, and
the first number is different from the second number.

8. The nonvolatile memory device of claim 7, wherein the first number is smaller than the second number.

9. The nonvolatile memory device of claim 7, wherein the first number is greater than the second number.

10. The nonvolatile memory device of claim 7, wherein at least a first portion of the one or more through-hole vias connect at least some portion of the plurality of bit-lines to at least some portion of the plurality of page buffer circuits, and wherein at least a second portion of the one or more through-hole vias connect at least some portion of the plurality of word-lines to at least some portion of the plurality of address decoders.

11. A nonvolatile memory device comprising:

a first semiconductor layer including an upper substrate in which a plurality of word-lines extending in a first direction and a plurality of bit-lines extending in a second direction perpendicular to the first direction are disposed and a memory cell array including a vertical structure on the upper substrate, wherein the vertical structure includes a plurality of memory blocks;

a second semiconductor layer under the first semiconductor layer in a third direction perpendicular to the first and second directions, wherein the second semiconductor layer includes a lower substrate that includes a plurality of address decoders and a plurality of page buffer circuits configured to control the memory cell array;

a control circuit configured to control the plurality of address decoders and the plurality of page buffer circuits in response to a command and an address from an external device; and a pad region disposed adjacent to the first semiconductor layer in the first direction and extending in the second direction, wherein the vertical structure includes a plurality of via areas in which one or more through-hole vias are provided and the plurality of via areas are spaced apart in the second direction, wherein the memory cell array at least includes a first mat, a second mat, a third mat and a fourth mat corresponding to different bit-lines of the plurality of bit-lines, and wherein the first mat is disposed within a first reference distance from the pad region in the first direction and the second mat is disposed out of the first reference distance from the pad region in the first direction, wherein the third mat is disposed within the first reference distance from the pad region in the first direction and the second mat is disposed out of the first reference distance from the pad region in the first direction, wherein each of the first mat and the second mat is out of a second reference distance from an edge of the pad region in the second direction, wherein each of the third mat and the fourth mat is within the second reference distance from the edge of the pad region in the second direction, and wherein:
each of the first mat and the second mat includes a first number of the via areas,
each of the third mat and the fourth mat includes a second number of the via areas, and
the first number is different from the second number.

12. The nonvolatile memory device of claim 11, wherein the first number is greater than the second number.

13. The nonvolatile memory device of claim 11, wherein the first number is smaller than the second number.

14. The nonvolatile memory device of claim 11, wherein at least a first portion of the one or more through-hole vias connect at least some portion of the plurality of bit-lines to at least some portion of the plurality of page buffer circuits, and wherein at least a second portion of the one or more through-hole vias connect at least some portion of the plurality of word-lines to at least some portion of the plurality of address decoders.

* * * * *